United States Patent
Oh et al.

(10) Patent No.: US 10,424,388 B2
(45) Date of Patent: Sep. 24, 2019

(54) STORAGE DEVICE, MEMORY SYSTEM, AND READ VOLTAGE DECISION METHOD THEREOF

(71) Applicant: SAMSUNG ELECTRONICS CO., LTD., Suwon-si, Gyeonggi-do (KR)

(72) Inventors: Hyunkyo Oh, Yongin-si (KR); Seungkyung Ro, Anyang-si (KR); Heewon Lee, Suwon-si (KR); Seongnam Kwon, Bucheon-si (KR); Oak-Ha Kim, Yongin-si (KR); Donggi Lee, Yongin-si (KR)

(73) Assignee: Samsung ELectronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 15/615,849

(22) Filed: Jun. 7, 2017

(65) Prior Publication Data

US 2018/0108422 A1    Apr. 19, 2018

(30) Foreign Application Priority Data

Oct. 18, 2016  (KR) ........................ 10-2016-0135274

(51) Int. Cl.
| | |
|---|---|
| *G11C 29/00* | (2006.01) |
| *G11C 16/34* | (2006.01) |
| *G06N 20/00* | (2019.01) |
| *G11C 29/04* | (2006.01) |
| *G11C 29/52* | (2006.01) |

(Continued)

(52) U.S. Cl.
CPC .......... *G11C 16/349* (2013.01); *G06N 20/00* (2019.01); *G11C 7/14* (2013.01); *G11C 11/5642* (2013.01); *G11C 16/26* (2013.01); *G11C 29/021* (2013.01); *G11C 29/028* (2013.01); *G11C 29/04* (2013.01); *G11C 29/42* (2013.01); *G11C 29/52* (2013.01); *G11C 16/0483* (2013.01)

(58) Field of Classification Search
CPC ... G11C 16/349; G11C 16/26; G11C 16/0483; G11C 7/14; G11C 11/5642; G11C 29/021; G11C 29/028; G11C 29/04; G11C 29/42; G11C 29/52; G06N 20/00; G06N 99/005
USPC ...... 714/718, 721, 745, 4.5, 6.1, 6.2, 22, 42, 714/43, 48; 365/201, 210.12
See application file for complete search history.

(56) References Cited

U.S. PATENT DOCUMENTS

| | | |
|---|---|---|
| 7,174,354 B2 | 2/2007 | Andreasson |
| 8,072,805 B2 | 12/2011 | Chou et al. |

(Continued)

*Primary Examiner* — Christine T. Tu
(74) *Attorney, Agent, or Firm* — Volentine, Whitt & Francos, PLLC

(57) ABSTRACT

A memory system includes multiple storage devices that each include a nonvolatile memory device. A client device is configured to collect deterioration information of the nonvolatile memory devices provided from the storage devices. A server device is configured to receive the collected deterioration information and to predict a degree of deterioration of the nonvolatile memory devices in real time by performing machine learning based on the collected deterioration information and initial deterioration information. The client device determines a read level of the nonvolatile memory device based on the degree of deterioration of the nonvolatile memory devices from the server device. The storage device sets the nonvolatile memory device to operate based on the read level determined in the client device.

20 Claims, 16 Drawing Sheets

(51) Int. Cl.
  *G11C 7/14*   (2006.01)
  *G11C 11/56*  (2006.01)
  *G11C 16/26*  (2006.01)
  *G11C 29/02*  (2006.01)
  *G11C 29/42*  (2006.01)
  *G11C 16/04*      (2006.01)

(56) References Cited

U.S. PATENT DOCUMENTS

| | | |
|---|---|---|
| 9,111,626 B2 | 8/2015 | Kim et al. |
| 9,164,881 B2 | 10/2015 | Seol et al. |
| 9,256,371 B2 | 2/2016 | Franceschini et al. |
| 9,922,706 B2 * | 3/2018 | Zeng .................. G06F 11/1048 |
| 2013/0117607 A1 * | 5/2013 | Sanford ................. G06F 15/18 |
| | | 714/26 |
| 2013/0117640 A1 * | 5/2013 | Tai ..................... G06F 11/1048 |
| | | 714/780 |
| 2016/0034349 A1 | 2/2016 | Choi et al. |
| 2016/0148703 A1 | 5/2016 | Kim et al. |
| 2016/0170871 A1 | 6/2016 | Hyun et al. |
| 2019/0006003 A1 * | 1/2019 | Kirshenbaum ..... G11C 11/5628 |

\* cited by examiner

STORAGE DEVICE, MEMORY SYSTEM, AND READ VOLTAGE DECISION METHOD THEREOF

CROSS-REFERENCE TO RELATED APPLICATIONS

A claim for priority under 35 U.S.C. § 119 is made to Korean Patent Application No. 10-2016-0135274, filed on Oct. 18, 2016 in the Korean Intellectual Property Office, the entire contents of which are hereby incorporated by reference.

BACKGROUND

Embodiments of the present disclosure relate to a nonvolatile memory device. More particularly, the present disclosure relates to a storage device that includes the nonvolatile memory device, as well as a memory system that includes such a storage device, and a method of deciding a read voltage of such a storage device.

A storage device (e.g., a solid state drive (SSD)) includes a nonvolatile memory. The storage device with the nonvolatile memory can retain data stored therein even at power-off, and therefore can advantageously store data for a long time. The storage device can be used as main storage in various electronic devices such as a computer, a smartphone, and a smart pad.

The nonvolatile memory of the storage device deteriorates due to various factors. The deterioration can be addressed by varying an operating condition based on the degree of deterioration. Manufacturers of these storage devices address the deterioration so as to adjust a level of a read voltage based on an operating condition of the storage device. However, according to the current methods of addressing deterioration, parameters of a storage device (e.g., read voltage levels) are set based on average usage patterns and use environments. Using average usage patterns and use environments highly restricts the driving environments of the storage devices. Accordingly, storage devices do not always provide optimum operating performances under various environments or deterioration levels.

SUMMARY

Embodiments of the present disclosure provide a storage device capable of providing optimum operating performances under various operating conditions or deterioration states, a memory system including the same, and a read voltage decision method thereof.

According to an aspect of an embodiment, a memory system includes multiple storage devices that each include a nonvolatile memory device. A client device is configured to collect deterioration information of a nonvolatile memory device provided from a storage device. A server device is configured to receive the collected deterioration information and to predict a deterioration factor and a degree of deterioration in real time by performing machine learning based on the collected deterioration information and initial deterioration information. The client device determines a read level of the nonvolatile memory device of the storage device based on the degree of deterioration predicted by the server device. The storage device sets the nonvolatile memory device to operate based on the read level determined in the client device.

According to another aspect of an embodiment, a method of deciding a read voltage of multiple storage devices connected to a network includes connecting a client with the storage devices and connecting a server with the client over the network. The client collects deterioration information generated from at least one of the storage devices. The server predicts a deterioration factor and a degree of deterioration of the storage devices in real time by performing machine learning based on the collected deterioration information and initial deterioration information. The client decides a read level of each of the storage devices based on the predicted deterioration factor or the predicted deterioration degree. The method also includes setting an operating condition of at least one of the storage devices based on the determined read level.

According to another aspect of an embodiment, a storage device includes a nonvolatile memory device and a storage controller. The storage controller is configured to write data in the nonvolatile memory device or read data stored in the nonvolatile memory device. The storage controller is also configured to set a read voltage of the nonvolatile memory device, and to detect or correct an error of the read data. The storage controller detects deterioration information of the nonvolatile memory device and transmits the detected deterioration information to a host of a client-server model, and sets the nonvolatile memory device with a read voltage that is received from the host and is predicted and determined through machine learning using the deterioration information.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Below, embodiments of the present disclosure will be described clearly and in detail with reference to accompanying drawings to such an extent that one of ordinary skill in the art can implement the embodiments.

Figure 1:
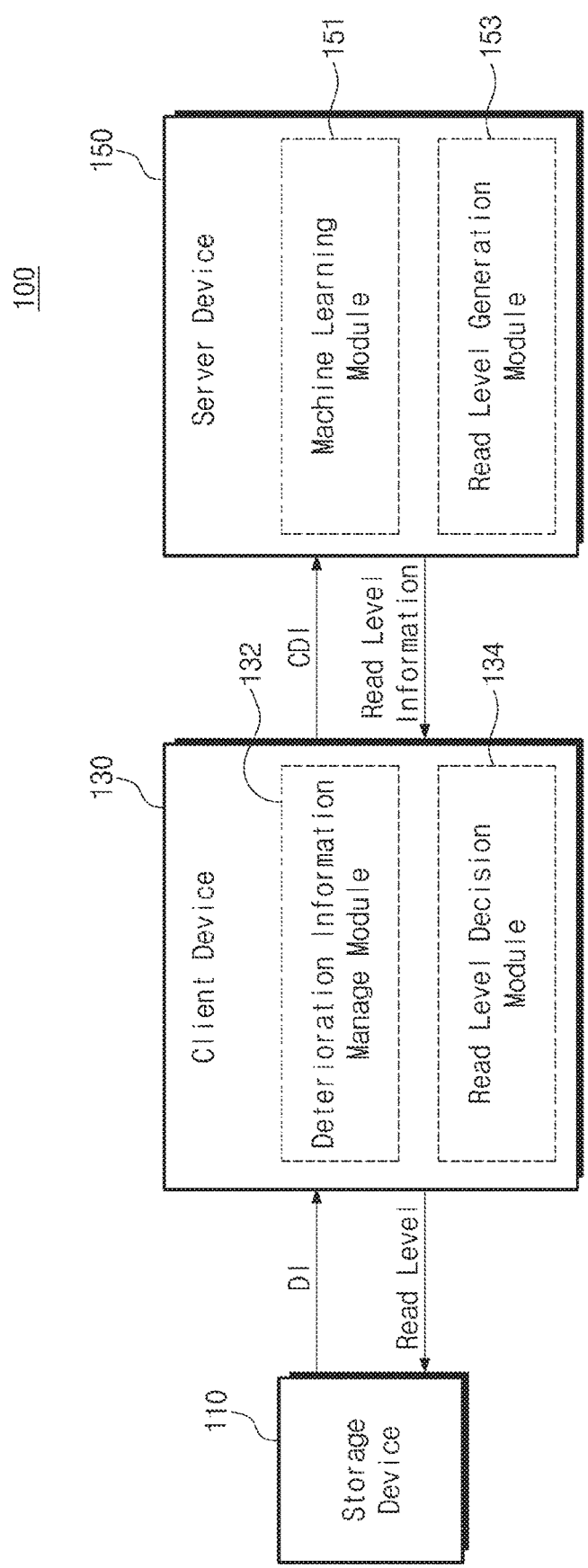
FIG. 1 is a block diagram illustrating a memory system, according to an embodiment of the present disclosure.

FIG. 1 is a block diagram illustrating a memory system, according to an embodiment of the present disclosure. Referring to FIG. 1, a memory system 100 may include a storage device 110, a client device 130, and a server device 150.

The storage device 110 may include at least one nonvolatile memory device NVM. The nonvolatile memory device NVM deteriorates with various environments or conditions. The degree of deterioration or the tendency of deterioration changes with the type of use purpose of the storage device 110 or the usage pattern of a user. The storage device 110 transmits deterioration information DI to the client device 130 periodically or when a specific event occurs. The deterioration information DI may include, for example, a program/erase count, a read count, a data retention time, temperature information, etc. in a specific deterioration state. Besides, the deterioration information DI may further include a location of a word line or a memory block, which corresponds to a specific deterioration state. Here, the specific deterioration state may correspond to a point in time when an uncorrectable error is generated or a point in time when error bits are detected, the number of which is a reference value or greater. However, it may be well understood that a condition at which the storage device 110 transmits the deterioration information DI is set according to various purposes without limitation to this disclosure.

The storage device 110 may transmit the deterioration information DI and may receive read level information determined in the client device 130. The storage device 110 may set a read voltage of the nonvolatile memory device NVM based on a read level provided from the client device 130.

The client device 130 senses the deterioration information DI provided from the storage device 110. The client device 130 transmits the sensed deterioration information DI of the storage device 110 to the server device 150. Although not illustrated in FIG. 1, multiple storage devices 110 may be connected to the client device 130. Accordingly, the client device 130 may receive the deterioration information DI from the storage devices 110. The client device 130 may be a host device that uses the storage devices 110 as storage. For example, the client device 130 may include a personal computer or a server group that is connected to the storage device 110. That is, according to an embodiment of the present disclosure, the client device 130 refers to a device that has a function of collecting the deterioration information DI of the storage device 110 and transmitting the collected deterioration information DI to the server device 150 that performs machine learning. In addition, the client device 130 may determine a read level of each storage device 110 based on the artificial intelligence AI or a rule provided from the server device 130.

To support the above-described function, according to an embodiment of the present disclosure, the client device 130 may include a deterioration information manage module 132 and a read level decision module 134. The deterioration information manage module 132 and the read level decision module 134 may be implemented with a device of a hardware form such as a processor or an application specific integrated circuit. However, the deterioration information manage module 132 and the read level decision module 134 may be provided with a software module that is driven in the client device 130, such as software instructions executed by a processor. Below, features of the present disclosure will be described through exemplification in which the deterioration information manage module 132 and the read level decision module 134 are implemented with a software module.

The server device 150 receives the collected deterioration information CDI provided from the client device 130. The server device 150 may receive the collected deterioration information CDI from multiple client devices. Accordingly, the server device 150 may obtain a large amount of collected deterioration information CDI. That is, the server device 150 may obtain the deterioration information DI, which is generated by various variables of various conditions, as big data. The server device 150 may analyze the big data of the collected deterioration information CDI through the machine learning ML. Through the machine learning ML, the server device 150 may identify a factor that has an influence on deterioration of a nonvolatile memory device. Also, the server device 150 may establish relationship between the identified factor(s) and the degree of deterioration of the nonvolatile memory device. The machine learning ML of the big data may be made by the machine learning module 151.

Afterwards, the server device 150 may determine an optimum read level corresponding to each condition or the degree of deterioration by using the relationship between the identified factor(s) and the degree of deterioration of the nonvolatile memory device, which is established through the machine learning. The decision of the read level may be made in the read level generating module 153. Read level information about a state, condition, or the degree of deterioration of the nonvolatile memory device, which is generated in the read level generation module 153, may be transmitted to the client device 130.

An optimum read level may be provided by the client device 130 adaptively or in real time to control the storage device 110. The optimum read level may be provided specifically for complex situations, based on current conditions, and based on the degree of deterioration that varies for each actual user environment. Deterioration information generated in various conditions and various situations may be processed as a large amount of big data, such as from many instances of deterioration information DI from one or more storage devices 110. An optimum read level may be determined for each situation through the machine learning. Accordingly, it is possible to quickly solve an issue due to an error or deterioration generated in real time, rather than only a read level determined in a restrictive condition.

Figure 2:
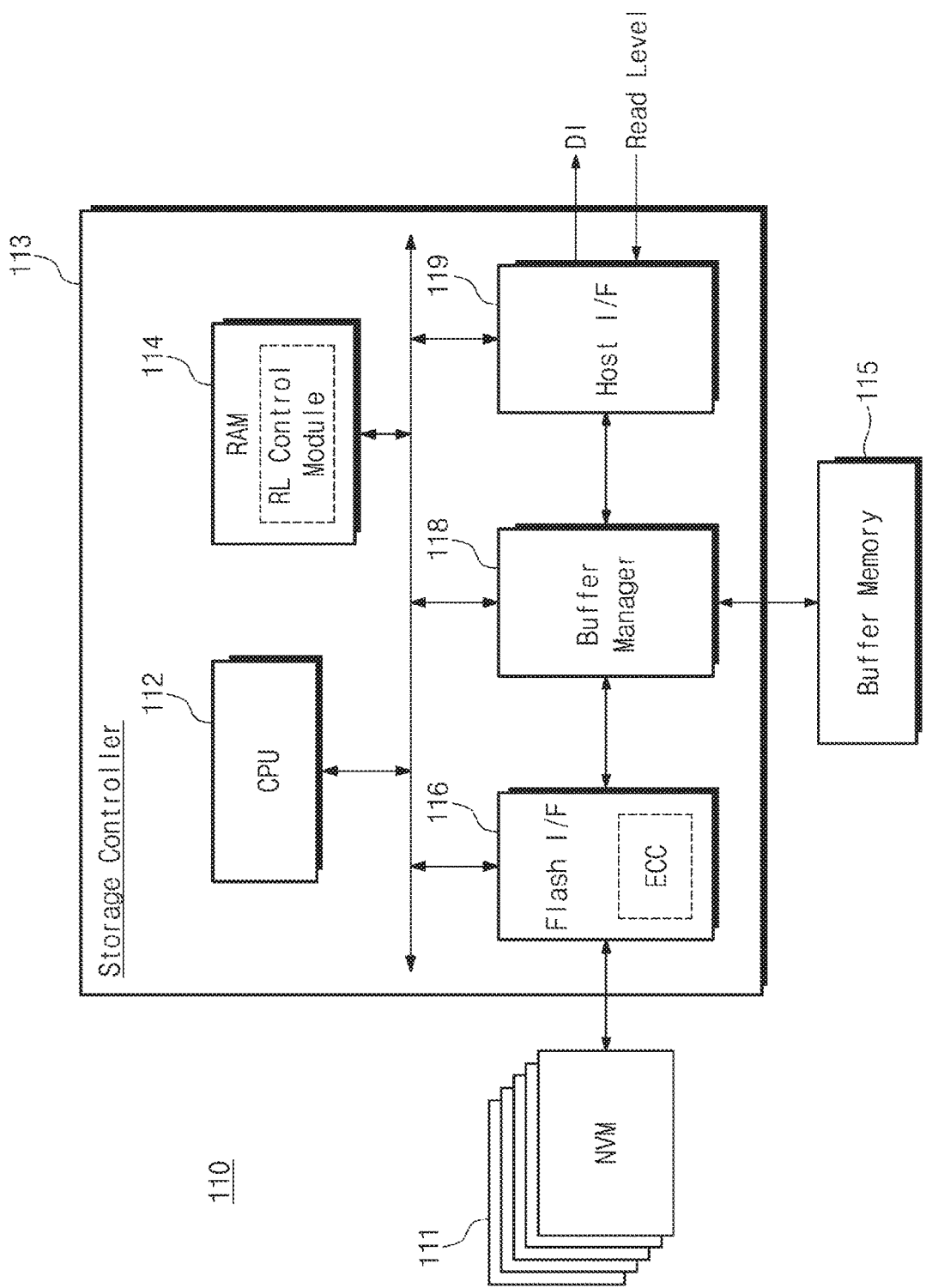
FIG. 2 is a block diagram illustrating a storage device, according to an embodiment of the present disclosure.

FIG. 2 is a block diagram illustrating a storage device, according to an embodiment of the present disclosure. Referring to FIG. 2, the storage device 110 may include a nonvolatile memory device 111, a storage controller 113, and a buffer memory 115.

The nonvolatile memory device 111 may perform a write operation, a read operation, and an erase operation under control of the controller 113. The nonvolatile memory device 111 may receive a write command, an address, and data from the storage controller 113 and may write the data in a storage space corresponding to the address. The nonvolatile memory device 111 may receive a read command and an address from the storage controller 113, may read data from a storage space corresponding to the address, and may output the read data to the storage controller 113. The nonvolatile memory device 111 may receive an erase command and an address from the storage controller 113 and may erase data of a storage space corresponding to the address.

The nonvolatile memory device 111 may include multiple memory blocks. Each of the memory blocks may include multiple memory cells. The memory cells may form a storage space of the nonvolatile memory device 111. Each of the memory blocks may further include selection transistors that allow memory cells to be selected independently of each other. The memory blocks may be distinguished according to an operational characteristic or a structural characteristic of the nonvolatile memory device 111.

The nonvolatile memory device 111 may include a flash memory, a phase change random access memory (PRAM), a ferroelectric RAM (FeRAM), a magnetic RAM (MRAM), a resistive RAM (RRAM), etc.

The storage controller 113 may access the nonvolatile memory device 111 and the buffer memory 115. The storage controller 113 may perform a write operation, a read operation, and an erase operation in response to a request of an external host device. The storage controller 113 may write write-requested data in the nonvolatile memory device 111 and may read read-requested data from the nonvolatile memory device 111 to output the read data to the external host device.

The storage controller 113 may manage the storage device 110 by using the buffer memory 115. For example, the storage controller 113 may temporarily store data to be written in the nonvolatile memory device 111 or data read from the nonvolatile memory device 111 in the buffer memory 115. The storage controller 113 may load metadata, which is needed to manage the nonvolatile memory device 111, on the buffer memory 115.

The storage controller 113 may generate the deterioration information DI of the nonvolatile memory device 111. For example, the storage device 113 may store and update a program/erase count for each of the memory blocks of the nonvolatile memory device 111, a read count for each of the memory blocks, temperature information, data retention information, access temperature information, location information of a to-be-accessed area etc., which are managed for wear leveling. The storage controller 113 may check the number of error bits of data that are read in a specific condition. When the check result indicates that the read data is uncorrectable, the storage controller 113 may generate deterioration information, which includes the number of error bits and a read level corresponding to the read data, and may transmit the deterioration information to the client device 130. If a specific event occurs even though a correctable error as well as the uncorrectable error is detected, the storage controller 113 may generate the deterioration information DI and may transmit the deterioration information DI to the client device 130.

The storage device 113 may determine a read voltage of the nonvolatile memory device 111 by using a read level provided from the client device 130. The storage controller 113 may control the nonvolatile memory device 111 so as to be set with the determined read voltage.

The storage controller 113 may include a central processing unit (CPU) 112, a RAM 114, a flash interface 116, a buffer manager 118, and a host interface 119.

The CPU 112 may control overall operations of the controller 113 and may execute a logical operation. The CPU 112 may communicate with the client device 130 through the host interface 119, may communicate with the nonvolatile memory device 111 through the flash interface 116, and may communicate with the buffer memory 115 through the buffer manager 118. The CPU 112 may control the storage device 110 by using the RAM 114 as a working memory, a cache memory, or a buffer memory. The CPU 112 may execute a read level (RL) control module loaded on the RAM 114. In the case where the read level control module is executed, the storage controller 113 may transmit a variety of deterioration information DI, which is generated in the nonvolatile memory device 111, to the client device 130. In the case where the read level control module is executed, the storage controller 113 may set a read voltage of the specific nonvolatile memory device 111 based on, or otherwise with reference to, the read level RL provided from the client device 130. Here, it may be well understood that the CPU 112 is implemented with a multi-core processor composed of multiple cores.

The RAM 114 may be used as a working memory, a cache memory, or a buffer memory of the CPU 112. The RAM 114 may store codes and commands that the CPU 112 executes. The RAM 114 may store data processed by the CPU 112. The RAM 114 may include a static RAM (SRAM). In particular, the read level control module may be stored in the RAM 114. In addition, a flash translation layer FTL and various memory management modules may be stored in the RAM 114. The flash translation layer FTL performs functions, which are performed for interfacing between the nonvolatile memory device 111 and the client device 130, such as address mapping, garbage collection, and wear leveling.

The flash interface 116 may be configured to communicate with the nonvolatile memory device 111 under control of the CPU 112. The flash interface 116 may convey a command, an address, and data to the nonvolatile memory device 111 through an input/output channel. The flash interface 116 may convey a control signal to the nonvolatile memory device 111 through a control channel.

The flash interface 116 may include an error correction block ECC. The error correction block ECC may perform error correction. The error correction block ECC may perform error correction encoding on data to be written in the nonvolatile memory device 111 through the flash interface 116. The error correction encoded data may be transferred to the nonvolatile memory device 111 through the flash interface 116. The error correction block ECC may perform error correction decoding on data received through the flash interface 116 from the nonvolatile memory device 111. In the case where an uncorrectable error is detected while performing the error correction decoding on data read from the nonvolatile memory interface 111, the flash interface 116 may notify the CPU 112 of the case. The CPU 112, for example, may generate the deterioration information DI in the above-described situation and may transmit the deterioration information DI to the client device 130.

The buffer manager 118 may control the buffer memory 115 under control of the CPU 112. The buffer manager 118 may control the buffer memory 115 to temporarily store data that the nonvolatile memory device 111 and the client device 130 exchange.

The host interface 119 may be configured to communicate with the external host device under control of the CPU 112. The host interface 119 may be configured to communicate using at least one of various communication manners, such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

Configurations and functions of the storage device 110 are briefly described above. The storage device 110 may generate deterioration information based on the number of error bits of read data or upon occurrence of a specific event and may transmit the deterioration information to the client device 130. In addition, the storage device 110 may set a level of a read voltage of the nonvolatile memory device 111 using the read level RL provided from the client device 130. For example, the storage device 110 may be implemented to have a form corresponding to any one of an SSD, a memory card, and an embedded memory card.

Figure 3:
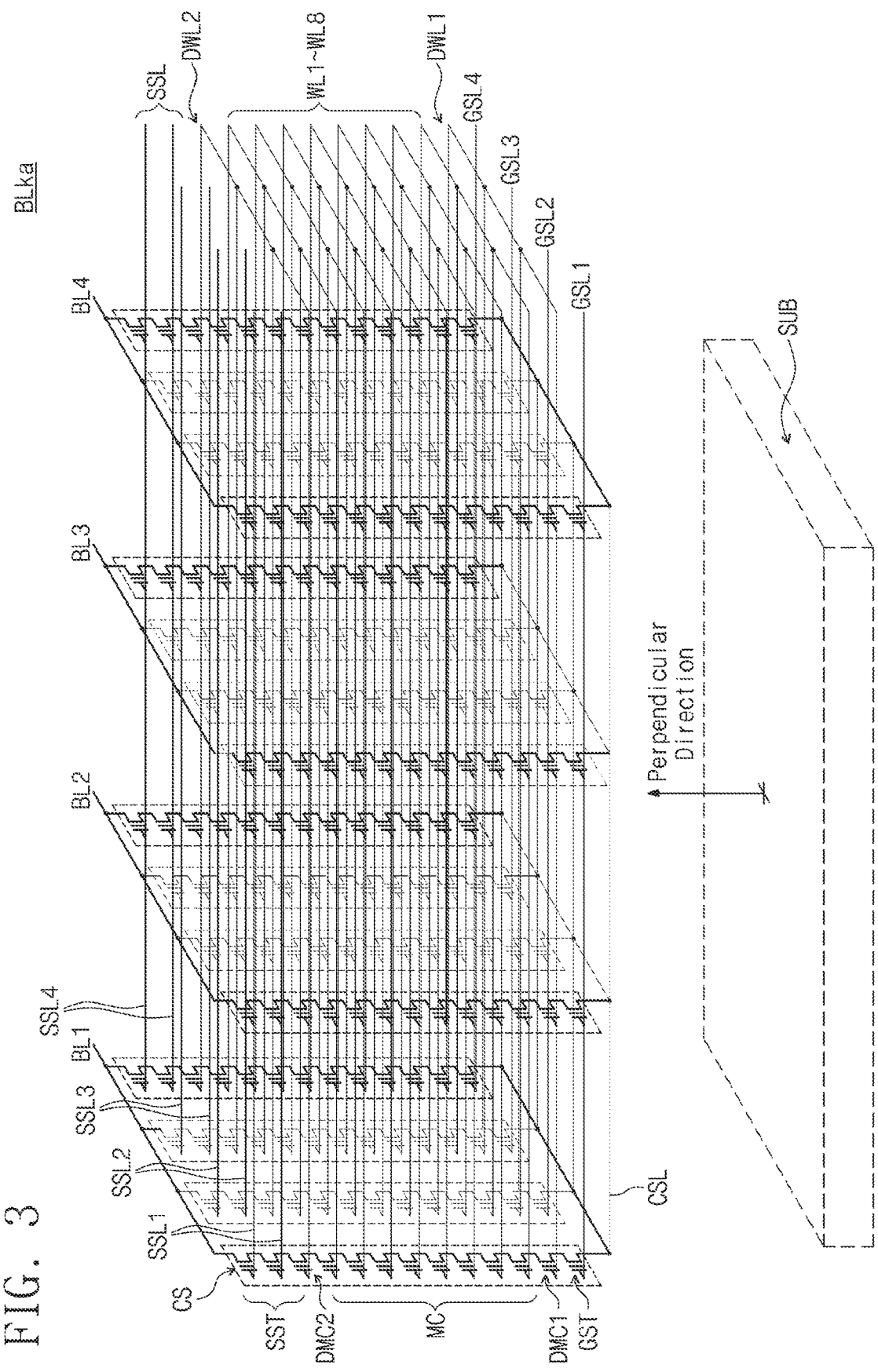
FIG. 3 illustrates an example of a memory block according to an embodiment of the present disclosure.

FIG. 3 illustrates an example of a memory block BLKa according to an embodiment of the present disclosure. Referring to FIG. 3, multiple cell strings CS may be arranged on a substrate SUB in rows and columns. The cell strings CS may be connected in common to a common source line CSL that is formed on (or in) the substrate SUB. An example of a location of the substrate SUB is provided to help understand a structure of the memory block BLKa. In an embodiment, the common source line CSL is connected to lower ends of the cell strings CS. However, it doesn't matter if the common source line CSL is electrically connected to the lower ends of the cell strings CS. However, embodiments of the present disclosure may not be limited to the case that the common source line CSL is physically located at the lower ends of the cell strings CS. In an embodiment, the cell strings CS are arranged in a four-by-four matrix. However, the number of cell strings CS in the memory block BLKa may increase or decrease.

Cell strings of each row may be connected to a corresponding one of first to fourth ground selection lines GSL1 to GSL4 and a corresponding one of first to fourth string selection lines SSL1 to SSL4. Cell strings of each column may be connected to a corresponding one of first to fourth bit lines BL1 to BL4. For ease of illustration, cell strings that are connected to the second and third ground selection lines GSL2 and GSL3 or the second and third string selection lines SSL2 and SSL3 are depicted to be blurry.

Each cell string CS may include at least one ground selection transistor GST connected to a corresponding ground selection line, a first dummy memory cell DMC1 connected to a first dummy word line DWL1, multiple memory cells MC respectively connected to multiple word lines WL1 to WL8, a second dummy memory cell DMC2 connected to a second dummy word line DWL2, and string selection transistors SST respectively connected to string selection lines SSL. In each cell string CS, the ground selection transistor GST, the first dummy memory cell DMC1, the memory cells MC, the second dummy memory cell DMC2, and the string selection transistors SST may be serially connected to each other along a direction perpendicular to the substrate SUB and may be sequentially stacked along a direction perpendicular to the substrate SUB.

In an embodiment, as illustrated in FIG. 3, one or more dummy memory cells (e.g., DMC1) may be arranged between the ground selection transistor GST and the memory cells MC in each cell string CS. In each cell string CS, one or more dummy memory cells (e.g., DMC2) may be arranged between the string selection transistors SST and the memory cells MC. In each cell string CS, one or more dummy memory cells (not labelled) may be arranged between the memory cells MC. The dummy memory cells (e.g., DMC1, DMC2) may have the same structure as the memory cells MC and may not be programmed (e.g., program inhibited) or may be programmed differently from the memory cells MC. For example, when memory cells are programmed to form two or more threshold voltage distributions, the dummy memory cells (e.g., DMC1, DMC2) may be programmed to have one threshold voltage distribution or to otherwise have fewer threshold voltage distributions than the memory cells MC.

Memory cells of the cell strings CS that are arranged at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. An embodiment is established in FIG. 2 as memory cells of the same height are connected to the same word line. However, the memory cells of the same height may be directly connected to each other in a plane where the memory cells are formed or may be indirectly connected to each other through another layer such as a metal layer.

Memory cells that correspond to a string (or ground) selection line and a word line may constitute a page. A write operation and a read operation may be performed by the page. In each page, each memory cell may store two or more bits. Bits that are written in memory cells belonging to one page may form logical pages. For example, k-th bits that are respectively written in memory cells of each page may form a k-th logical page.

The memory block BLKa may be provided as a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an embodiment of the present disclosure, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as multiple levels, with word lines and/or bit lines shared between levels: U.S. Pat. Nos. 7,679,133; 8,553,466; 8,654,587; 8,559,235; and US Pat. Pub. No. 2011/0233648.

Figure 4:
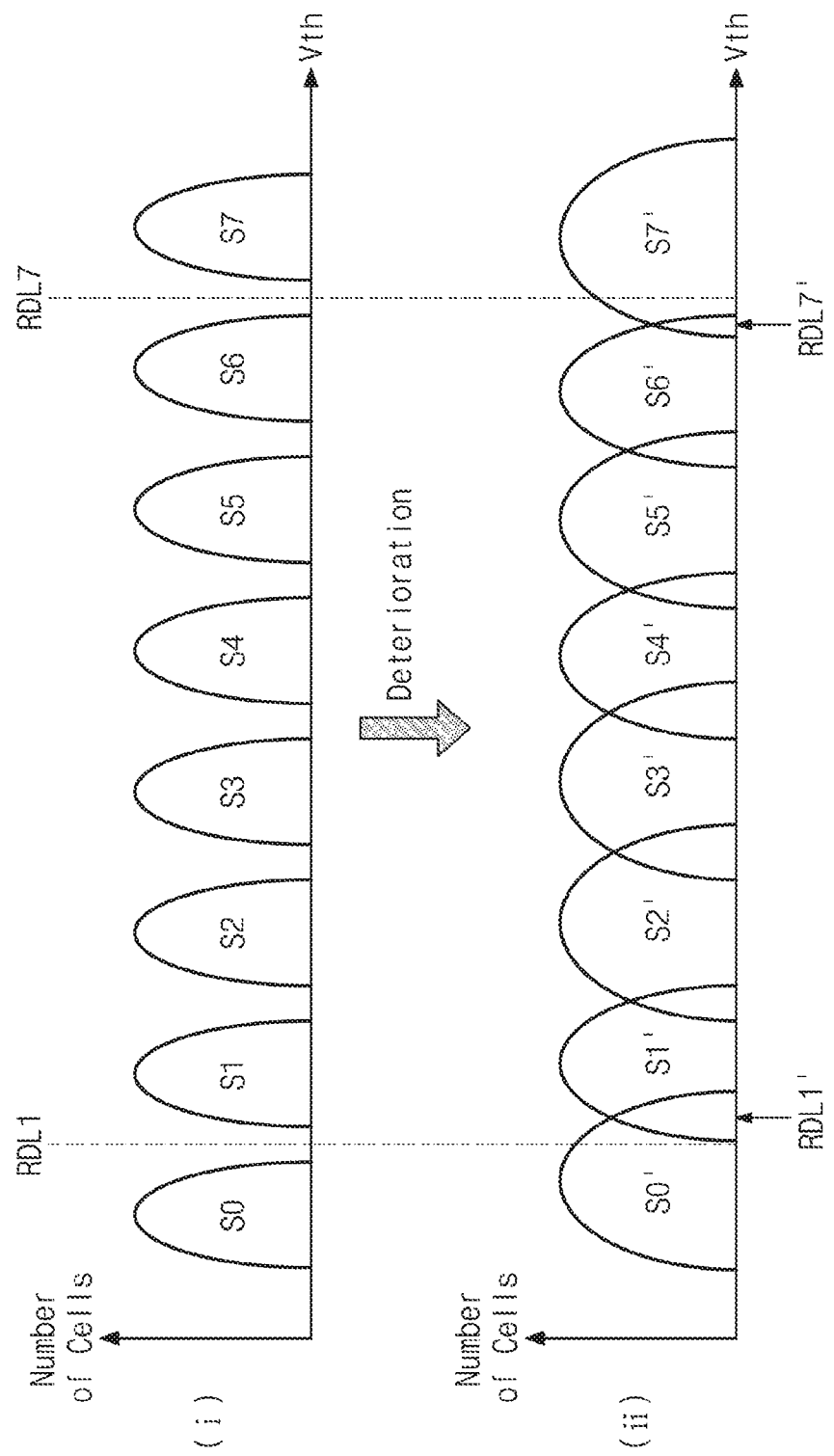
FIG. 4 is a drawing illustrating an influence due to deterioration of a nonvolatile memory device.

FIG. 4 is a drawing illustrating an influence due to deterioration of the nonvolatile memory device 111. Referring to FIG. 4, threshold voltages of memory cells illustrated in FIG. 3 may change from a first state (i) to a second state (ii) due to deterioration. Here, in the first and second states (i) and (ii), the ordinate represents a threshold voltage of each memory cell, and the abscissa represents the number of memory cells.

The first state (I), for example, shows a threshold voltage distribution immediately after data are programmed in the memory cells. However, the first state (i) may change into the second state (ii) due to an increase of a program/erase cycle, an increase of a read count, or various deterioration factors. After data are written in a memory cell, deterioration of the memory cell may progress due to disturbance or retention. The disturbance refers to a phenomenon in which threshold voltages of memory cells vary with programming, reading, erasing, coupling, etc. generated in a periphery of memory cells. The retention refers to a phenomenon in which threshold voltages of memory cells vary as charges trapped in charge trap layers of the memory cells through programming are discharged over time.

Eight states S0 to S7 may be distinguished according to threshold voltages of memory cells in a condition of the first state (i). For example, an erase state S0 and a program state S1 may be distinguished by using a read voltage RDL1. A program state S6 and a program state S7 may be distinguished by using a read voltage RDL7. However, in the second state (ii) showing a threshold voltage distribution after deterioration progresses, the read voltage RDL1 is no longer appropriate to distinguish the degraded states S0' and S1'. An uncorrectable error may be generated upon sensing data corresponding to the deteriorated states S0' and S1' by using the read voltage RDL1. Sensing of a deteriorated memory cell using a first provided read voltage may cause an uncorrectable error. In this case, the storage device 110 may drive an algorithm (e.g., valley search) for deciding exact read voltages RDL1' to RDL7'. The above-described way causes a decrease of performance of the storage device 110 and may increase costs due to consumption of resources.

A read operation condition of the storage device 110 may be adjusted such that the read voltages RDL1' to RDL7' are determined according to a characteristic of deterioration before the above-described uncorrectable error is generated. Pieces of deterioration information that are generated in various conditions may be analyzed by a machine learning algorithm of a client-server model for deciding a read voltage. Accordingly, deterioration factors may be classified for each condition by processing pieces of deterioration information of all storage devices connected to the server device 150 over a network through the machine learning. Also, it is possible to estimate optimum read voltages, which correspond to the classified deterioration conditions, for respective storage devices.

Figure 5:
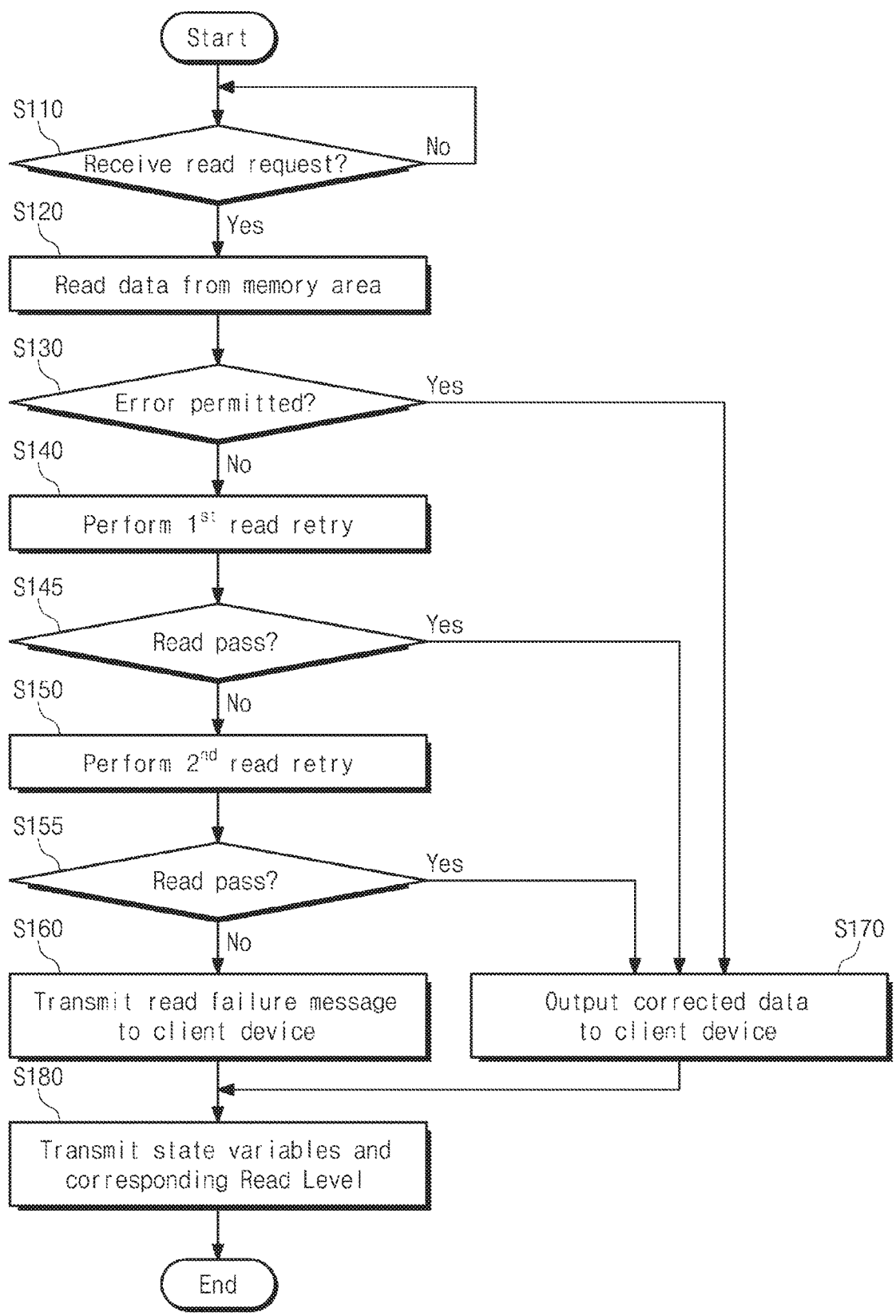
FIG. 5 is a flowchart illustrating an operation of the storage device, according to an embodiment of the present disclosure.

FIG. 5 is a flowchart illustrating an operation of the storage device 110, according to an embodiment of the present disclosure. A procedure of generating and transmitting the deterioration information DI at the storage device 110 will be described with reference to FIGS. 2 and 5 as an example. However, it may be understood that a type or a range of the deterioration information DI is not limited to the specific teachings of this disclosure.

In operation S110, the storage device 110 monitors whether a read request from the client device 130 is present. If the read request from the client device 130 is received (Yes), the process proceeds to operation S120. In contrast, if the read request from the client device 130 is absent (No), the storage device 110 may continue to monitor whether the read request is received.

In operation S120, the storage controller 113 (refer to FIG. 2) may transfer a read command and an address to the nonvolatile memory device 111 (refer to FIG. 2) to read read-requested data. The nonvolatile memory device 111 may sense data from a memory cell in response to the read command and the address and may output the sensed data to the storage controller 113.

In operation S130, the storage controller 113 may detect an error of data output from the nonvolatile memory device 111. The storage controller 113 branches based on the number of error bits thus detected. If the number of error bits of the read data corresponds to a permissible (or correctable) level, the process proceeds to operation S170. However, if the number of error bits of the read data corresponds to an uncorrectable level, the process proceeds to operation S140. Here the term "permissible" means that the detected error is correctable through an error correction code.

In operation S140, the storage controller 113 performs first read retry for accessing the nonvolatile memory device 111 using a read voltage that is adjusted at a point in time when the uncorrectable error is generated. In the first read retry, a read operation may be performed on the nonvolatile memory device 110 using a read voltage that is defined in a table (a pre-defined table or a temp bump table) provided when the storage device 110 is released. The table (a pre-defined table or a temp bump table) includes an offset value for adjusting a default read voltage. A read retry operation may be performed once or several times using a read voltage corresponding to an offset value.

In operation S145, the storage controller 113 determines whether the read retry operation is successful. For example, if the number of error bits detected from data output through the first read retry operation is a reference value or less, it may be determined that the first read retry operation is successful. In this case, the process may proceed to operation S170. If the number of error bits detected from data output through the first read retry operation exceeds the reference value, it may be determined that the first read retry operation is not successful. Afterwards, the procedure may proceed to step S150.

In operation S150, the storage controller 113 performs a second read retry. The second read retry may be a read operation to which a valley search operation and/or any of various cell count techniques is/are applied. The valley search operation is applied to detect a read voltage for deteriorated memory cells. Accordingly, the second read retry operation refers to an operation that needs a relatively long time and relatively many resources. If the second read retry is completed, data of the nonvolatile memory device 111 may be read using a determined read voltage.

In operation S155, the storage controller 113 determines whether the second read retry is successful. For example, if the number of error bits detected from data output through the second read retry operation is the reference value or less, it may be determined that the second read retry operation is successful. In this case, the process may proceed to operation S170. In contrast, if the number of error bits detected from data output through the second read retry operation exceeds the reference value, it may be determined that the second read retry operation is not successful. Afterwards, the procedure may proceed to step S160.

In operation S160, the storage controller 113 may transmit a read failure message to the client device 130.

In operation S170, the storage controller 113 may transmit the read data or error-corrected data to the client device 130.

In operation S180, the storage controller 113 may transmit deterioration information about each situation to the client device 130. For example, the storage controller 113 may provide the client device 130 with status information, such as a level of a read voltage used in operation S140, a program/erase count, a read count, a data retention time, and a temperature in a program or read operation, as the deterioration information DI. Alternatively, the storage controller 113 may provide the client device 130 with status information, such as a level of a read voltage used in operation S150, a program/erase count, a read count, a data retention time, and a temperature in a program or read operation, as the deterioration information DI.

In embodiments described above, the storage device 110 generates the deterioration information DI and provides the deterioration information DI to the client device 130. Here, an embodiment is described as the deterioration information DI is provided based on the number of error bits. However, embodiments of the present disclosure may not be limited thereto. For example, it may be well understood that a variety of status information detected in a read operation, as well as the number of error bits, is transmitted as the deterioration information DI in real time to the client device 130.

Figure 6:
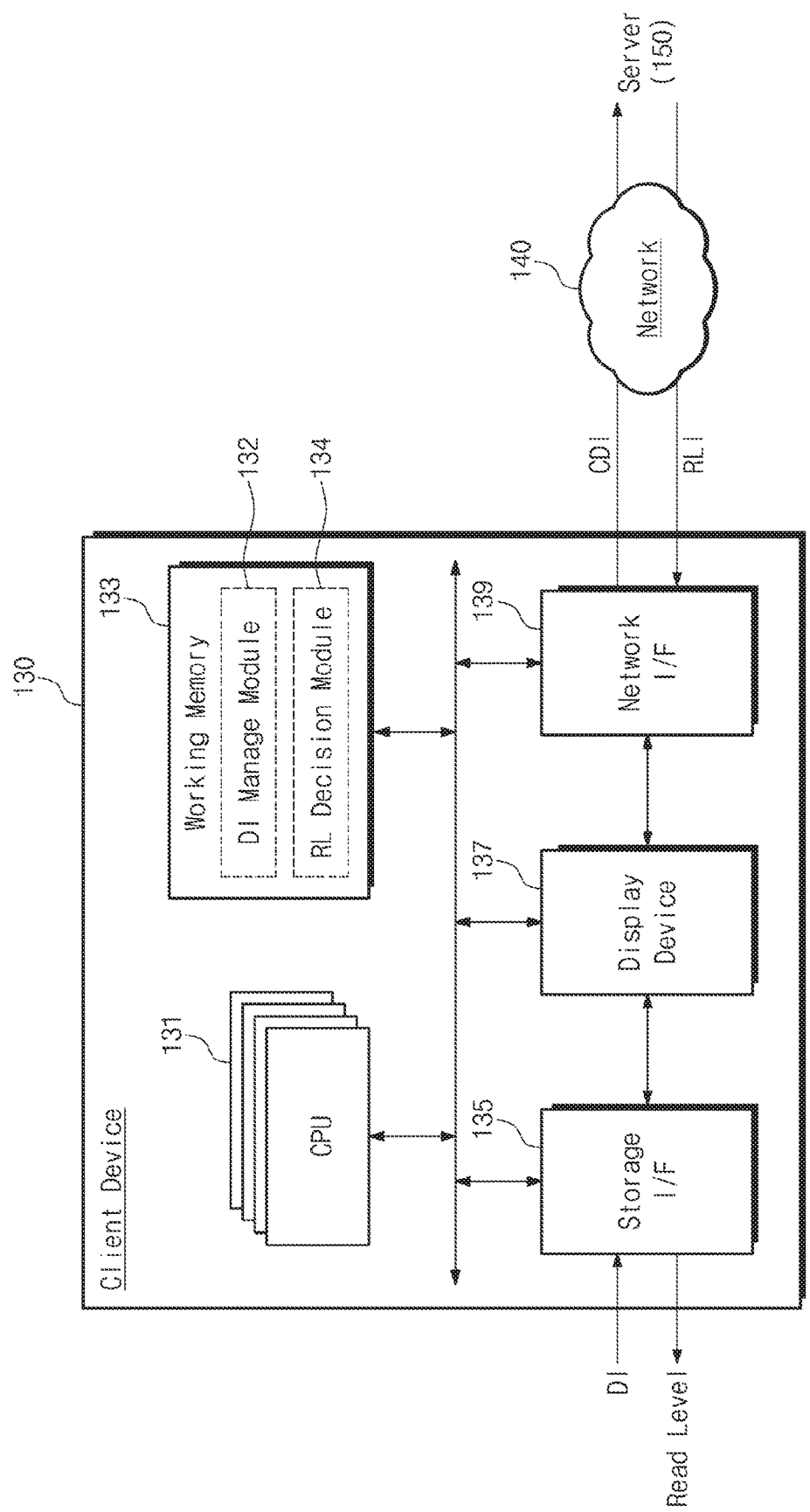
FIG. 6 is a block diagram illustrating a client device, to an embodiment of the present disclosure.

FIG. 6 is a block diagram illustrating the client device 130, to an embodiment of the present disclosure. Referring to FIG. 6, the client device 130 may collect the deterioration information DI from the storage device 110 and may transmit the collected deterioration information CDI to the server device 150 over a network 140. In addition, the client device 130 may determine a read voltage of the storage device 110 using read level information provided from the server device 150. In an embodiment, the client device 130 may include a CPU 131, a working memory 133, a storage interface 135, a display device 137, and a network interface 139.

The CPU 131 may execute software such as various application programs or an operating system for controlling pieces of hardware of the client device 130. In particular, the CPU 131 executes a deterioration information manage module 132 and a read level decision module 134 that are loaded on the working memory 133. The CPU 131 communicates with the storage device 110 through the storage interface 135. Here, it may be well understood that the storage interface 135 is connected, or is configured to be connected, with multiple storage devices. The CPU 131 may communicate with the server device 150 through the network interface 139 over the network 140.

In the case where the deterioration information manage module 132 is executed, the CPU 131 may receive and collect pieces of deterioration information DI from all storage devices connected to the storage interface 135. As the deterioration information manage module 132 is executed, the CPU 131 transmits the collected deterioration information CDI to the server device 150 over the network 140. According to an operation of the deterioration information manage module 132, the client device 130 may continue to transmit the deterioration information DI from the storage devices 110 to the server device 150. Accordingly, machine learning is continuously made in the server device 150 based on the provided deterioration information DI, and a read level corresponding to various environments and events is continuously updated.

As the read level decision module 134 is executed, the CPU 131 receives the read level information RLI transferred from the server device 150 through the network interface 139. When a read level needs to be adjusted, the read level decision module 134 determines a read level RL for the storage device 110 using the received read level information RLI. The read level RL determined by the read level decision module 134 may be transferred to the corresponding storage device 110 through the storage interface 135.

The display device 137 is a device that displays an operation of the client device 130 or displays input/output to/from the client device 130. The display device 137 is not necessarily included in the client device 130.

Figure 7:
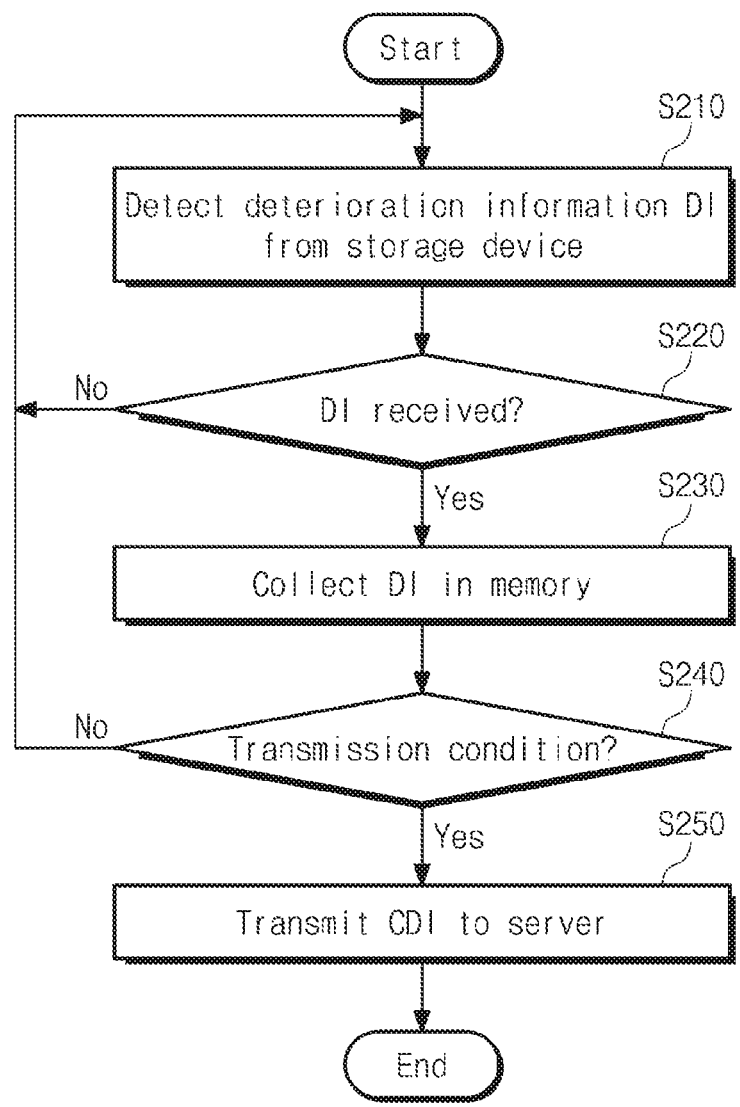
FIG. 7 is a flowchart illustrating an operation of a deterioration information manage module that is executed in the client device of FIG. 6.

FIG. 7 is a flowchart illustrating an operation of the deterioration information manage module 132 that is executed in a client device of FIG. 6. Referring to FIG. 7, the client device 130 may collect the deterioration information DI from the storage device 110 and may transmit the collected deterioration information CDI to the server device 150.

In operation S210, the client device 130 may detect whether the deterioration information DI is present in a variety of data transmitted from the storage device 110 through the storage interface 135.

In operation S220, the client device 130 may branch when an input of the deterioration information DI is detected. That is, if it is determined that the deterioration information DI is transferred from one or more of multiple storage devices (S220=Yes), the process proceeds to operation S230. In contrast, if it is determined that the deterioration information DI is absent (S220=No), the client device 130 may continue the operation of detecting whether the deterioration information DI is received.

In operation S230, the client device 130 may collect the deterioration information DI provided from respective storage devices based on a detection algorithm of the deterioration information manage module 132 executed in the CPU 131. The collected deterioration information CDI may be stored in a memory that is included in the client device 130.

In operation S240, the client device 130 determines whether the collected deterioration information CDI satisfies a condition for transmission to the server device 150. If the condition for transmission to the server device 150 is satisfied, the process proceeds to operation S250. However, if the condition for transmission to the server device 150 is not satisfied, the process proceeds to operation S210.

In operation S250, the client device 130 transmits the collected deterioration information CDI to the server device 150.

An example in which the client device 130 collects the deterioration information DI and the collected deterioration information is transmitted to the server device 150 is described above. However, it may be well understood that the deterioration information DI is directly transmitted to the server device 150 without being accumulated in the client device 130.

Figure 8:
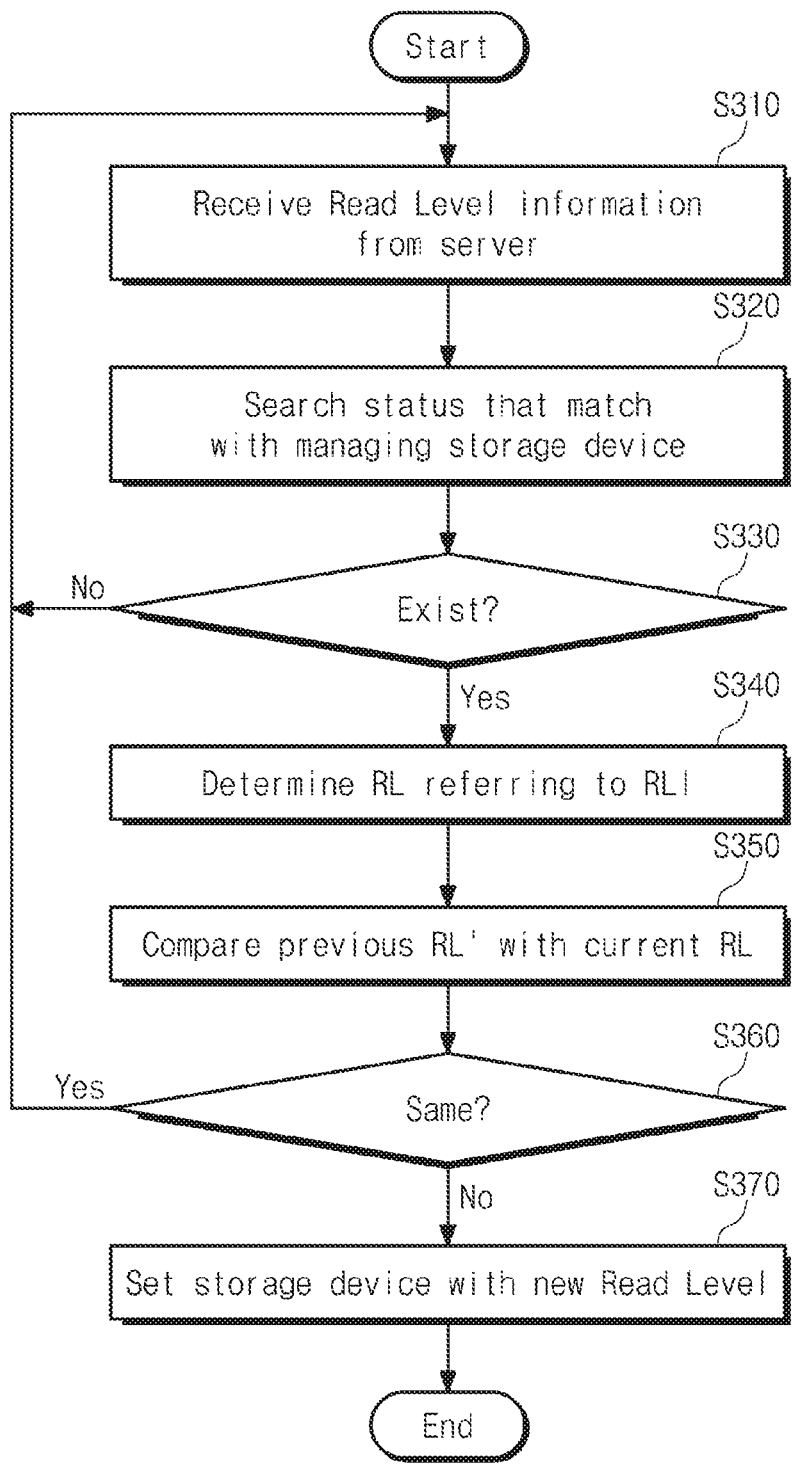
FIG. 8 is a flowchart illustrating an operation of a read level decision module that is executed in the client device of FIG. 6.

FIG. 8 is a flowchart illustrating an operation of the read level decision module 134 that is executed in a client device of FIG. 6. Referring to FIG. 8, the client device 130 may determine an optimum read level of each storage device based on read level information RDI that is determined by the server device 150 through the machine learning.

In operation S310, the client device 130 receives the read level information RLI transmitted from the server device 150 through the network interface 139. The read level information RLI includes an optimum read level in each of various deterioration states.

In operation S320, the client device 130 detects whether a storage device 110 has a deterioration state that matches with the read level information RLI. The storage device 110 may be one of multiple storage devices that the client device 130 manages. Alternatively, the client device 130 may detect whether a storage device 110, among the managed storage devices 110, has a deterioration state that closely matches the read level information RLI.

In operation S330, if it is determined that the storage device 110 corresponding to a deterioration state defined in the read level information RLI is present (S330=Yes), the process proceeds to operation S340. However, if it is determined that the storage device 110 does not correspond to a deterioration condition defined in the read level information RLI provided from the server device 150 (S330=No), the process returns to operation S310.

In operation S340, the client device 130 determines the read level RL for the specific storage device 110.

In operation S350, the client device 130 compares a previous read level RL' with the read level RL determined in operation S340.

In operation S360, a branching operation may be made according to the comparison result of the determined read level RL and the previous read level RL'. If the newly determined read level RL is the same as the previous read level RL' (S360=Yes), the process returns to operation S310. However, if the newly determined read level RL is different from the previous read level RL' (S360=No), the process proceeds to operation S370.

In operation S370, the client device 130 may set a read condition of the storage device 110 with the newly determined read level RL.

In embodiments above, a deterioration information collecting and transmitting operation of the client device 130 is described, and an operation of deciding a read level of each storage device using the read level information RLI is described.

Figure 9:
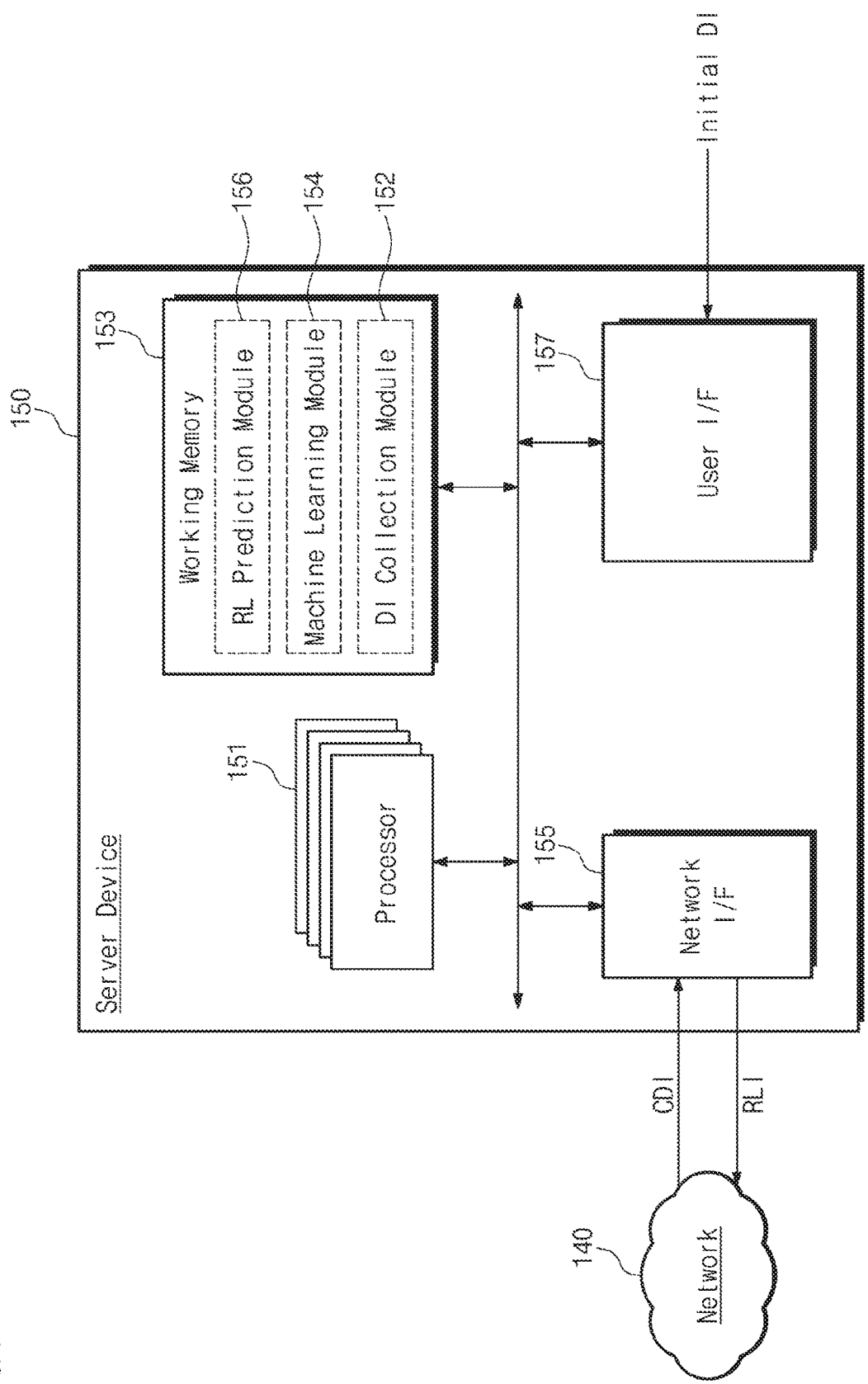
FIG. 9 is a block diagram illustrating a configuration of the server device, according to an embodiment of the present disclosure.

FIG. 9 is a block diagram illustrating a configuration of the server device 150, according to an embodiment of the present disclosure. Referring to FIG. 9, the server device 150 may include a processor 151, a working memory 153, a network interface 155, and a user interface 157.

The processor 151 drives software modules of various algorithms executed by the server device 150. For example, the processor 151 may call and execute an application program, an operating system, and/or device drivers from the working memory 153 or a memory, such as a read only memory (ROM), for a principle function of the server device 150. In particular, the processor 151 may execute a deterioration information collection module 152, a machine learning module 154, and a read level prediction module 156 to determine a read level through the machine learning that is based on initial deterioration information DI and collected deterioration information DI. As explained herein, initial deterioration information DI may be one or more settings initially input by a user, or set by a manufacturer or distributor etc. Collected deterioration information DI may be deterioration information DI collected after the initial deterioration information DI is input or otherwise set.

An operating system OS, application programs, and various pieces of processed data may be loaded on the working memory 153. In particular, the deterioration information collection module 152, the machine learning module 154, and the read level prediction module 156 may be loaded on the working memory 153 to predict a read level of the storage device 110 by processing the deterioration information DI. The deterioration information DI is processed in the form of big data. For example, the deterioration information may be added to a pool of numerous previous instances of deterioration information DI from the same storage device 110, along with even more previous instances of deterioration information DI from other storage devices 110. The collective deterioration information DI and associated data derived from the collective deterioration information DI may constitute the big data.

The network interface 155 provides a communication channel for data exchange between the server device 150 and the client device 130. The server device 150 may be provided with the collected deterioration information CDI from the client device 130 through the network interface 155. The server device 150 may transmit the read level information RLI, which is generated through the machine learning ML, to the client device 130 through the network interface 155. It may be well understood that the network interface 155 is provided according to various wired or wireless communication protocols.

The user interface 157 provides interfacing between the server device 150 and a user. The input interface 157 may include various input/output devices. The initial deterioration information IDI may be provided to the server device 150 through the user interface 157, although initial deterioration information may also be set by a variety of other mechanisms and sources including by a manufacturer, a distributor, and so on.

According to the above description, the server device 150 may generate an optimum read level information (RLI) based on the collected deterioration information CDI provided from the client device 130 and the initial deterioration information IDI provided by the user. The server device 150 may transmit the optimum read level information to the client device 130. In addition, the server device 150 may update the optimum read level information periodically or, if necessary, e.g., on demand. Accordingly, when new deterioration information DI is provided, information associated with the new deterioration information DI may be updated, and the updated result may be provided to the client device 130.

Figure 10:
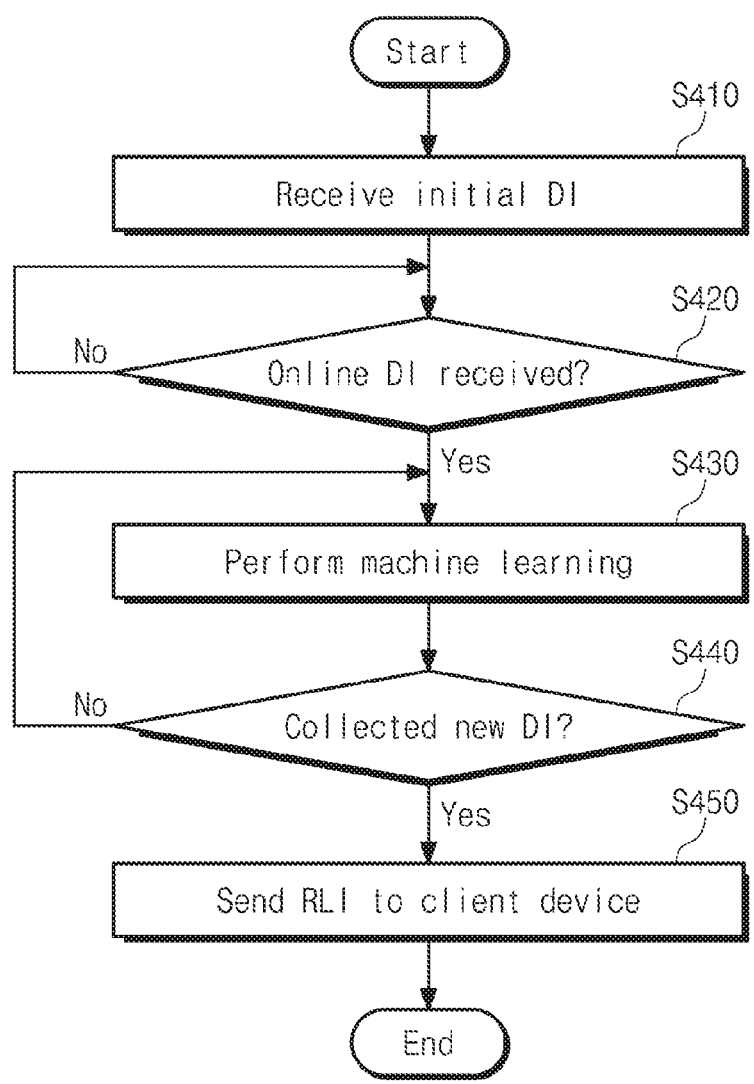
FIG. 10 is a flowchart illustrating a method in which the server device of FIG. 9 determines an optimum read level.

FIG. 10 is a flowchart illustrating a method in which the server device 150 of FIG. 9 determines an optimum read level. An operation that is performed in the server device 150 will be described with reference to FIGS. 9 and 10.

In operation S410, the server device 150 obtains initial deterioration information IDI that is present in the user interface 157 or is separately provided from the data storage device 110. The initial deterioration information IDI may be deterioration information that is obtained by a manufacturer through a test upon manufacturing the storage device 110, or by a downstream intermediary such as a distributor, or by, for example, an end user. For example, the initial deterioration information IDI may be obtained in an initial set of tests performed when a user first starts a computer after purchase In operation S420, the server device 150 detects whether collected online deterioration information DI transferred through the network interface 155 is present. Collection of the deterioration information in operation S410 and operation S420 may be made by driving the deterioration information collection module 152. If the online deterioration information DI collected through the network interface 155 is absent, operation S420 is repeated until the online deterioration information DI is received. In contrast, if the online deterioration information DI transmitted from the client device 130 is present, the process proceeds to operation S430.

In operation S430, the server device 150 performs machine learning ML by using the initial deterioration information IDI and the online deterioration information ODI. A read level of storage devices may be determined based on, or otherwise with reference to, factors of deterioration deduced as the machine learning result. For the machine learning and the read level decision, the server device 150 may execute the machine learning module 154 and the read level prediction module 156.

In operation 440, the server device 150 may detect whether the deterioration information collection module 152 receives new deterioration information from the client device 130. If the new deterioration information DI is present, the process returns to operation S430. The server device 150 may perform the machine learning and the read level decision by using previously used deterioration information derived from big data, along with the newly received deterioration information. However, if reception of the new deterioration information is not detected within a reference time, the process proceeds to operation S450.

In operation S450, the server device 150 may transmit the determined read level information RLI to the client device 130.

According to the above description, it may be possible to find a factor of deterioration by performing machine learning on big data that is built based on deterioration information collected by the server device 150. A read level of storage devices, which corresponds to each deterioration state, may be determined based on, or otherwise with reference to, the found factor of deterioration.

Figure 11:
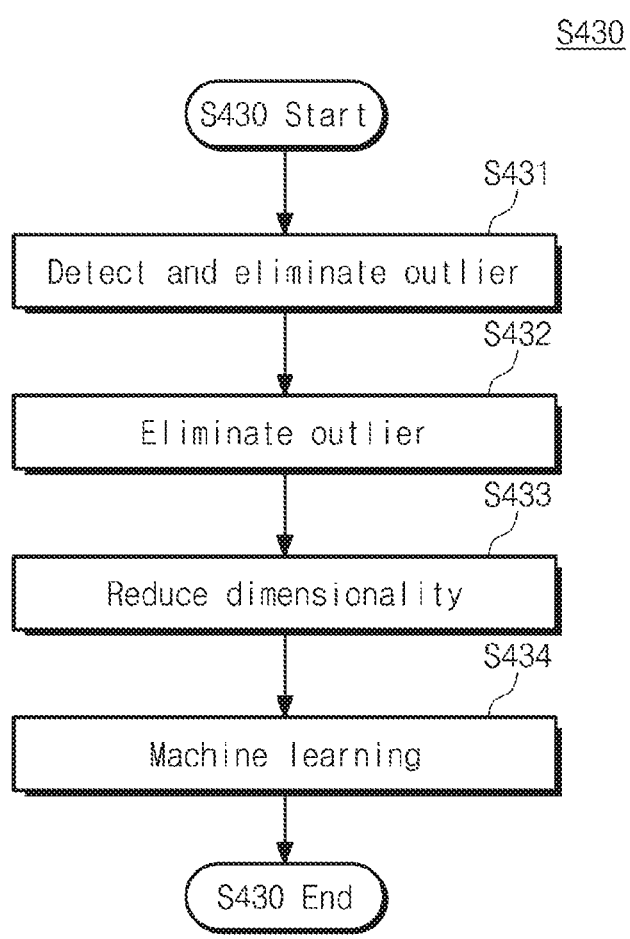
FIG. 11 is a flowchart for more fully describing operation S430 in which machine learning is performed so that a read level decision of FIG. 10 can be made.

FIG. 11 is a flowchart for more fully describing operation S430 in which machine learning is performed so that a read level decision of FIG. 10 can be made. Referring to FIG. 11, the server device 150 may process the online deterioration information ODI from client devices and the initial deterioration information IDI through the machine learning and may generate an optimum read level based on the processing result.

In operation S431, the server device 150 may perform outlier detection and elimination on the initial deterioration information IDI and the online deterioration information ODI provided in the form of big data. If the outlier is present in the big data, the performance of the machine learning may markedly decrease. Accordingly, the server device 150 performs an outlier detection operation for eliminating the outlier. A technology such as statistical distribution-based outlier detection may be used as an example of an algorithm for outlier detection. If the outlier of the initial deterioration information and the online deterioration information ODI is detected, the outlier is eliminated from the big data.

In operation S433, the server device 150 reduces a large amount of big data. The dimensionality reduction technology may be used to extract a critical factor having an influence on deterioration of a nonvolatile memory device from big data including the outlier. Principal component analysis (PCA), singular value decomposition (SVD), non-negative matrix factorization (NMF), etc. may be used as the dimensionality reduction technology.

In operation S434, the machine learning is made to identify a correlation between meaningful deterioration information. It may be possible to create a table by using optimum read levels corresponding to deterioration states through the machine learning. Alternatively, an equation corresponding to the read level RL may be deduced by using interpolation or linear regression based on sorted data. If the equation is deduced, it is possible to predict a read level by using a continuous value that agrees with the deduced equation. In addition, classification may be used as an example of the machine learning. A read level corresponding to deterioration information may be predicted by building a data-based decision tree as an example of classification. Here, multiple regression analysis, logistic regression, RANSAC (RANdom SAmple Consensus), etc. may be used as the linear regression. In addition, techniques such as random forest and adaboost may be used as the classification technique.

The machine learning (ML) technique of the server device 150 is described by way of example above. However, it may be well understood that the machine learning or a preprocessing process of the server device 150 for the machine learning is variable, and may be performed in other ways.

Figure 12:
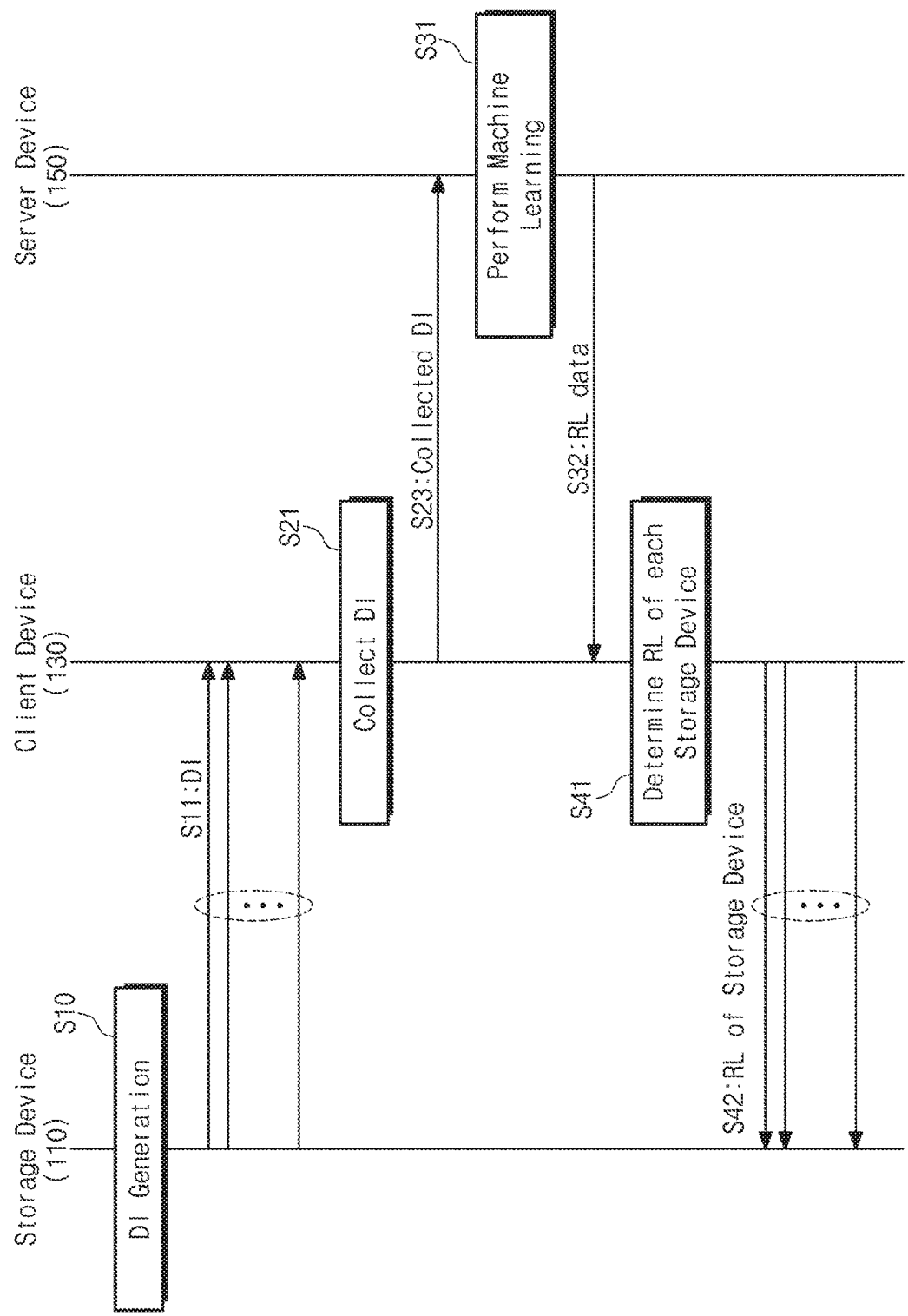
FIG. 12 is a drawing illustrating an operation of a storage device that is controlled by using a client-server model, according to an embodiment of the present disclosure.

FIG. 12 is a drawing illustrating an operation of a storage device 110 that is controlled by using a client-server model, according to an embodiment of the present disclosure. Referring to FIG. 12, in response to real-time deterioration information DI provided from the storage device 110, the client device 130 and the server device 150 may return an optimum read level through the machine learning. Accordingly, since various deterioration states and wide state information are used for the machine learning, it is possible to provide an optimum read level corresponding to a deterioration state of a specific storage device.

In operation S10, the storage device 110 may generate the deterioration information DI. For example, it is assumed that an uncorrectable error is detected from read data of the storage device 110. In this case, the storage device 110 may generate the deterioration information DI that includes a read level, a location of a memory area, a program/erase count, a retention time, temperature information, etc. at a point in time when the uncorrectable error is generated.

In operation S11, the storage device 110 transmits the generated deterioration information DI to the client device 130. Multiple storage devices 110 may be connected to the client device 130. Accordingly, the client device 130 may receive the deterioration information DI from the multiple storage devices 110. As noted already, a service device 150 may receive deterioration information DI from multiple client devices 130, and each client device 130 may receive deterioration information DI from multiple storage devices 110.

In operation S21, the client device 130 collects the deterioration information DI. The client device 130 may accumulate the collected deterioration information and may store the accumulated deterioration information in a memory.

In operation S23, the client device 130 transmits the collected deterioration information DI to the server device 150.

In operation S31, the server device 150 may perform the machine learning by using the deterioration information DI provided from multiple client devices 130 as big data. The read level RL corresponding to specific conditions or a deterioration state may be determined as the machine learning result.

In operation S32, the server device 150 transmits the determined read level RL to the client device 130. Here, the read level may be provided in the form of a table or as a variety of mapping information.

In operation S41, the client device 130 may determine a read voltage of the storage device 110, which corresponds to a specific deterioration state, by using the read level RL.

In operation S42, the client device 130 may control the storage device 110 to read data by using the determined read level.

As described above, it is possible to collect a variety of deterioration information of a storage device 110 using a client-server model. Also as described above, it is possible to select an exact read level of the storage device 110 by performing machine learning on collected big data derived from multiple instances of deterioration information from multiple storage devices 110.

Figure 13:
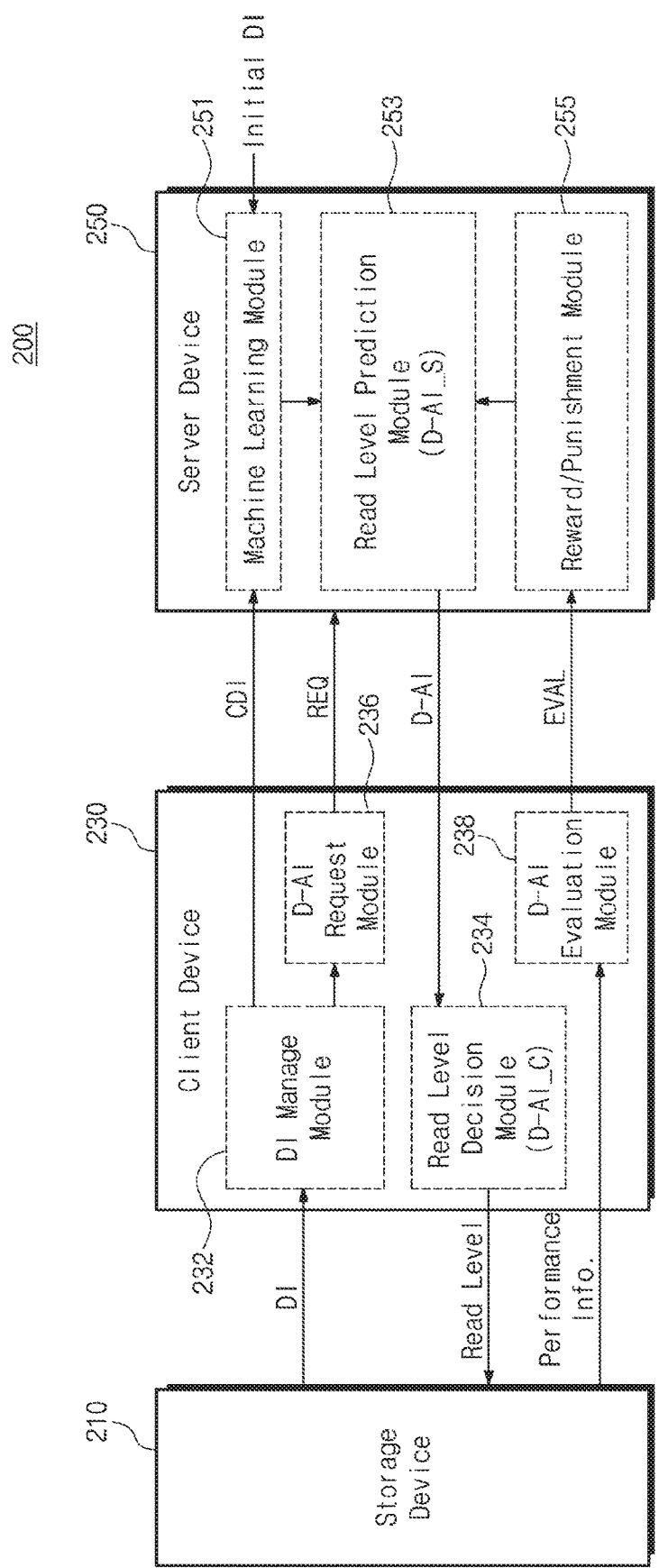
FIG. 13 is a block diagram illustrating a memory system of a client-server model, according to another embodiment of the present disclosure.

FIG. 13 is a block diagram illustrating a memory system 200 of a client-server model, according to another embodiment of the present disclosure. Referring to FIG. 13, the memory system 200 may include a storage device 210, a client device 230, and a server device 250. The client device 230 and the server device 250 build artificial intelligence AI, which provides an optimum read level of the storage device 210 in real time, by performing the machine learning based on the collected deterioration information DI. In addition, it may be possible to maintain an artificial intelligence (AI) model of optimum performance by evaluating the performance of the built artificial intelligence AI.

The storage device 210 is substantially the same as the storage device of FIG. 1. The storage device 210 includes at least one nonvolatile memory device NVM and provides the deterioration information DI of the nonvolatile memory device NVM to the client device 230. The storage device 210 receives information about the determined read level RL from the client device 230. In addition, the storage device 210 may provide the client device 230 with information of performance, which is achieved upon applying the updated read level RL, periodically or, if necessary, on demand.

The client device 230 collects the deterioration information DI provided from the storage device 110. The client device 230 transmits the collected deterioration information CDI to the server device 250 and requests a defense artificial intelligence D-AI corresponding to the collected deterioration information CDI. For example, the client device 230 may include a deterioration information manage module 232 that performs sensing, collection, and transmission of the deterioration information DI. The client device 230 may include a defense artificial intelligence request module 236 that requests a new version of defense artificial intelligence D-AI from the server device 250 in response to sensing new deterioration information DI.

In addition, the client device 230 may include a read level decision module 234 that determines a read level on a client side. The read level decision module 234 may be updated with the defense artificial intelligence D-AI provided from the server device 250. That is, the read level decision module 234 corresponds to the defense artificial intelligence D-AI from the client side. The client device 230 has a function of evaluating newly built defense artificial intelligence D-AI. The function of evaluating the defense artificial intelligence D-AI may be performed by a defense artificial intelligence evaluation module 238. The defense artificial intelligence evaluation module 238 performs comparison and evaluation on performance of a previous version of defense artificial intelligence D-AI and performance of the updated defense artificial intelligence D-AI. The defense artificial intelligence evaluation module 238 transfers the evaluation result EVAL to the server device 250. The evaluation result EVAL may be, for example, reward information or punishment information.

The server device 250 may include a machine learning module 251 that analyzes the collected deterioration information CDI and the initial deterioration information through the machine learning. The server device 250 may further include a read level prediction module 253 that predicts read levels corresponding to all deterioration states by using information obtained from big data through the machine learning. The read level prediction module 253 generates or otherwise corresponds to defense artificial intelligence D-AI on the server side. The server device 250 further includes a reward and punishment module 255 that performs reward and punishment on the read level prediction module 253 of a current version based on the evaluation information EVAL provided from the client device 230.

The server device 250 builds a new version of defense artificial intelligence D-AI in the client device 230 and the server device 250 in response to the collected deterioration information CDI and a defense artificial intelligence request REQ of the client device 230. The defense artificial intelligence D-AI may be composed of the updated read level decision module 234 and the read level prediction module 253. The server device 250 and the client device 230 perform evaluation on the defense artificial intelligence D-AI of a new version and apply the evaluation result to the defense artificial intelligence D-AI. That is, the server device 230 and the client device 250 maintain the defense artificial intelligence D-AI in a state of optimum performance by performing reinforcement learning on the defense artificial intelligence D-AI.

Figure 14:
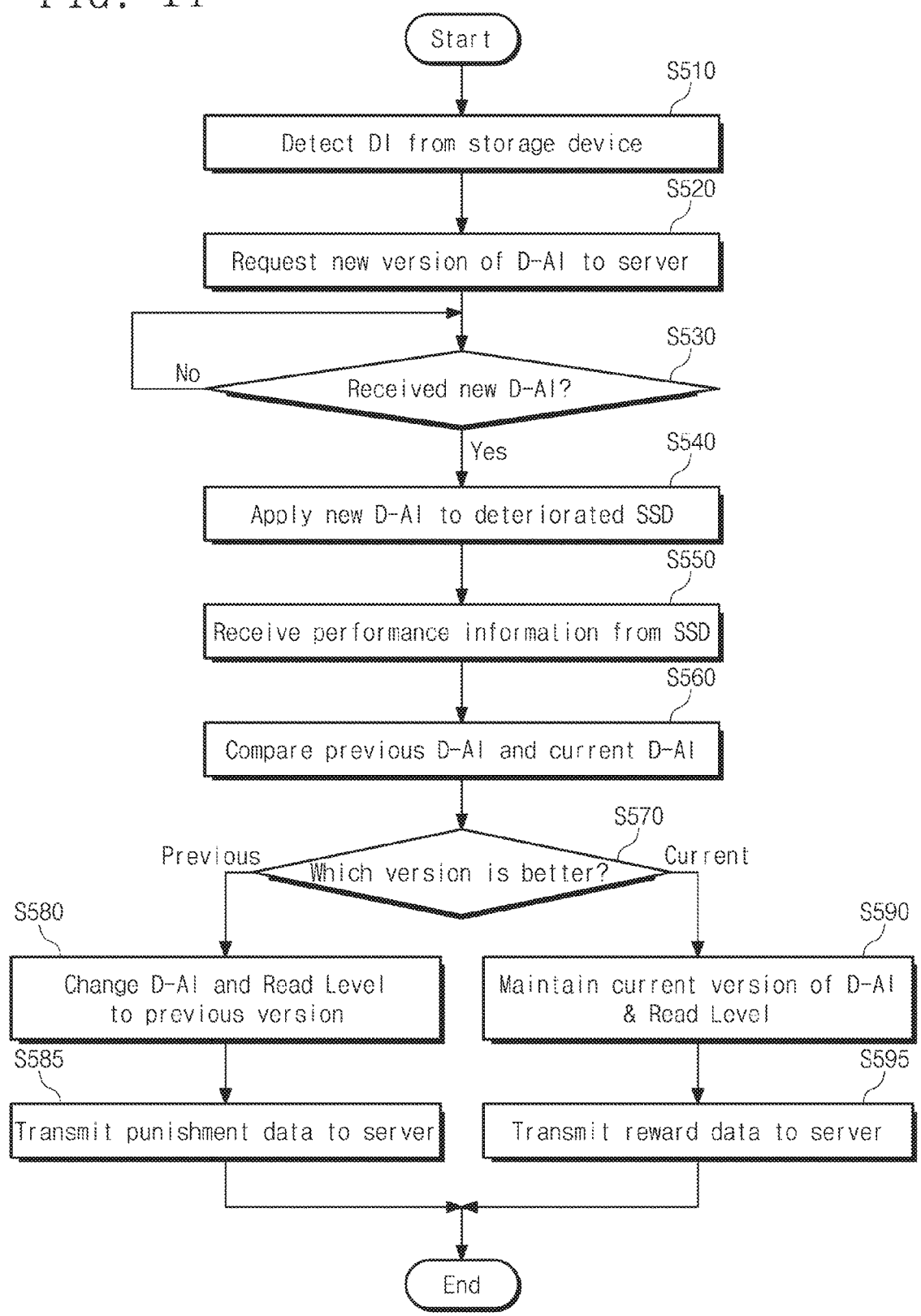
FIG. 14 is a flowchart illustrating an operation of the client device for reinforcement learning.

FIG. 14 is a flowchart illustrating an operation of the client device 230 for reinforcement learning. A method of evaluating and updating a read level decision module (or defense artificial intelligence) of the client device 230 is illustrated in FIG. 14.

In operation S510, the client device 230 detects whether the deterioration information DI is transferred from the storage device 210, through monitoring. When the transfer of the deterioration information DI is detected, the client device 230 transfers the transferred deterioration information DI or the collected deterioration information CDI to the server device 250.

In operation S520, the client device 230 requests a new version of defense artificial intelligence D-AI from the server device 250 in response to the deterioration information DI from the storage device 210. That is, the current client device 230 determines that the read level RL determined by the running defense artificial intelligence D-AI needs to be adjusted. An operation of requesting the defense artificial intelligence D-AI may be performed by the defense artificial intelligence request module 236 illustrated in FIG. 13.

In operation S530, the client device 230 monitors whether new defense artificial intelligence D-AI is received from the server device 250. If it is determined that new defense artificial intelligence D-AI is not received from the server device 250 (S530=No), the client device 230 waits until new defense artificial intelligence D-AI is received. In contrast, if it is determined that new defense artificial intelligence D-AI is received (S530=Yes), the process proceeds to operation S540.

In operation S540, the client device 230 executes the new defense artificial intelligence D-AI received from the server device 250. As the new defense artificial intelligence D-AI is executed, the read level decision module 234 of the client device 230 and the read level prediction module 253 of the server device 250 are changed. A new read level RL' may be transferred to the storage device 210 after being generated by the changed modules.

In operation S550, the client device 230 receives performance information about the new read level RL' from the storage device 210. The performance information may include, for example, information indicating whether an error is generated in read data, information indicating the number of error bits detected from the read data, etc. However, it may be understood that categories of the performance information are not limited to this disclosure.

In operation S560, the client device 230 evaluates performance of currently running defense artificial intelligence D-AI by using the performance information. The evaluating of the defense artificial intelligence D-AI may be performed by the defense artificial intelligence evaluation module 238. The defense artificial intelligence evaluation module 238 may evaluate the performances of the currently running defense artificial intelligence D-AI and a previously driven defense artificial intelligence D-AI.

In operation S570, the client device 230 may branch according to the performance evaluation result. If it is determined that the performance of the current defense artificial intelligence D-AI is not better than the performance of the previous defense artificial intelligence D-AI (previous), the process proceeds to operation S580. If it is determined that the performance of the current defense artificial intelligence D-AI is better than the performance of the previous defense artificial intelligence D-AI (current), the process proceeds to operation S590.

In operation S580, the client device 230 replaces the current version of defense artificial intelligence D-AI, which is currently running in the client device 230, with the previous version of defense artificial intelligence D-AI. In operation S585, the client device 230 transmits punishment data to the server device 250.

In operation S590, the client device 230 maintains the current version of defense artificial intelligence D-AI that is currently running in the client device 230. In operation S595, the client device 230 transmits reward data to the server device 250.

A function of the defense artificial intelligence D-AI for reinforcement learning, which is executed in the client device 230, is described above. The client device 230 performs the reinforcement learning in a manner of transmitting evaluation information about the running defense artificial intelligence D-AI to the server device 250.

Figure 15:
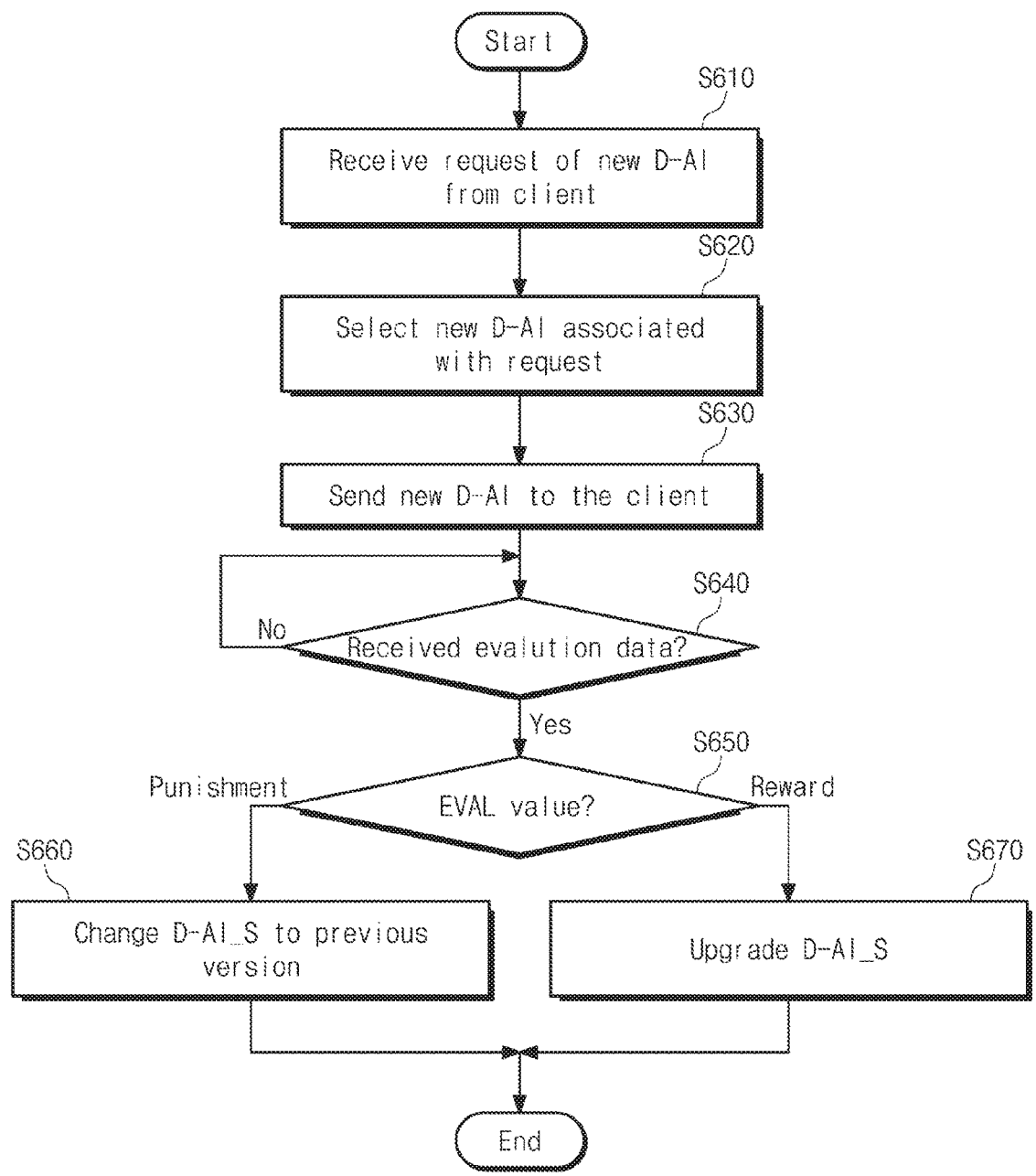
FIG. 15 is a flowchart illustrating an operation of the server device for reinforcement learning.

FIG. 15 is a flowchart illustrating an operation of the server device 250 for reinforcement learning. A method of evaluating and updating a read level prediction module (or defense artificial intelligence) of the server device 250 is illustrated in FIG. 15.

In operation S610, the server device 250 receives a request for a new version of defense artificial intelligence D-AI from the client device 230.

In operation S620, the server device 250 selects a new version of defense artificial intelligence D-AI in response to the request from the client device 230. The new version of defense artificial intelligence D-AI may be selected according to a characteristic of the client device 230 that issues the request. For example, the new version of defense artificial intelligence D-AI may be selected based on, or otherwise with reference to, a history, which is provided from the client device 230, such as the deterioration information DI.

In operation S630, the server device 250 transmits the selected new version of defense artificial intelligence D-AI to the client device 230. In this case, the client device 230 executes the defense artificial intelligence D-AI of the new version and evaluates the execution result. If the evaluation is completed, the client device 230 may transmit the evaluation result EVAL.

In operation S640, the server device 250 monitors whether the evaluation result EVAL of the new version of defense artificial intelligence D-AI is received from the client device 230. If it is determined that the evaluation result EVAL is not received (No), the server device 250 may continue to monitor whether the evaluation result EVAL is received. In contrast, if it is determined that the evaluation result EVAL is received, the process proceeds to operation S650.

In operation S650, the client device 250 may branch according to the evaluation result EVAL. If the evaluation result EVAL corresponds to punishment, the process proceeds to operation S660. In contrast, if the evaluation result EVAL corresponds to reward, the process proceeds to operation S670.

In operation S660, the server device 250 replaces defense artificial intelligence D-AI, which is currently running therein, with the previous version of defense artificial intelligence D-AI.

In operation S670, the server device 250 maintains the defense artificial intelligence D-AI that is currently running therein. Alternatively, the server device 250 may update defense artificial intelligence D-AI_S currently running therein by using the received deterioration information DI.

A function of evaluating and updating the defense artificial intelligence D-AI for reinforcement learning, which is executed in the server device 230, is described above. The server device 250 may build the server-side defense artificial intelligence D-AI_S for deciding an optimum read level based on evaluation information provided from the client device 230.

Figure 16:
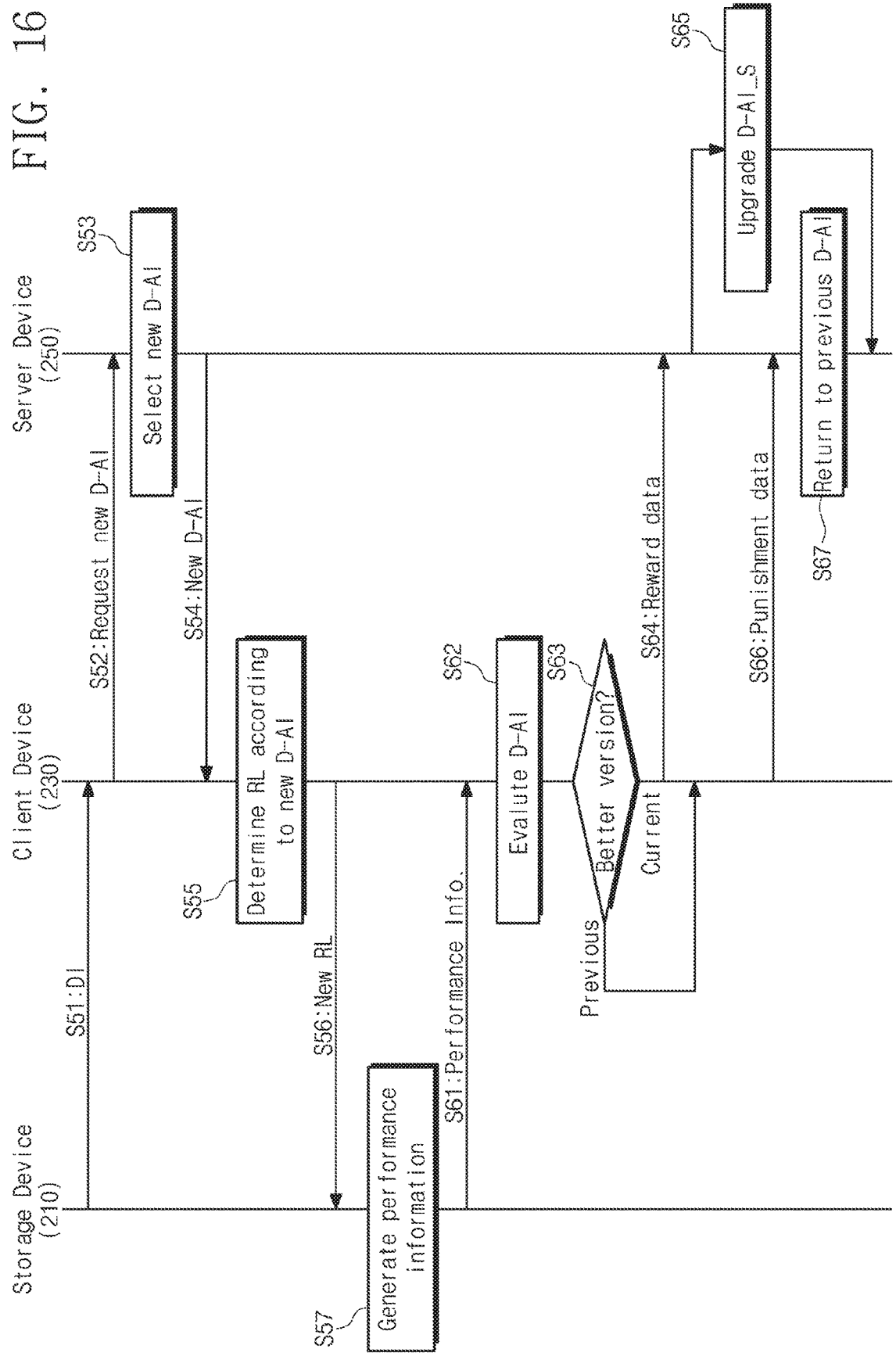
FIG. 16 is a drawing illustrating an operation of a storage device to which a client-server model of FIG. 13 is applied.

FIG. 16 is a drawing illustrating an operation of a storage device to which a client-server model of FIG. 13 is applied. Referring to FIG. 16, the defense artificial intelligence D-AI that is built in the client device 230 and the server device 250 may supply a read level, which is capable of securing optimum performance through reinforcement learning, to the storage device 210 in real time.

In operation S51, the storage device 210 generates the deterioration information DI and transmits the generated deterioration information DI to the client device 230. For example, it is assumed that an uncorrectable error is detected from read data of the storage device 210. The storage device 210 may generate the deterioration information DI that includes a read level, a location of a memory area, a program/erase count, a retention time, temperature information, etc. at a point in time when the uncorrectable error is generated.

In operation S52, the server device 230 requests a new version of defense artificial intelligence D-AI from the server device 250 in response to receiving the deterioration information DI.

In operation S53, the server device 250 selects a new version of defense artificial intelligence D-AI corresponding to the client device 230.

In operation S54, the server device 250 transmits the selected new version of defense artificial intelligence D-AI to the client device 230.

In operation S55, the client device 230 executes the new version of client-side defense artificial intelligence D-AI transferred from the server device 250. As the client-side defense artificial intelligence D-AI is executed, a read level of the storage device 210 that transfers the deterioration information DI is determined.

In operation S56, the client device 230 transmits the determined new read level RL to the storage device 210.

In operation S57, the storage device 210 generates performance information as a result of determining effectiveness of the new read level RL.

In operation S61, the storage device 210 provides the performance information to the client device 230.

In operation S62, the client device 230 evaluates currently running defense artificial intelligence D-AI by using the performance information. For example, performance of a previously executed defense artificial intelligence D-AI may be compared with performance of the currently running defense artificial intelligence D-AI.

In operation S63, the client device 230 may branch according to the performance evaluation result. If the performance of the currently running defense artificial intelligence D-AI is better than the performance of the previously executed defense artificial intelligence D-AI, operation S64 is performed. In operation S64, the client device 230 transmits reward data to the server device 250. If the performance of the previously executed defense artificial intelligence D-AI is better than the performance of the currently running defense artificial intelligence D-AI, operation S66 is performed. In operation S66, the client device 230 may transmit the punishment data to the server device 250.

In operation S65, the server device 250 may upgrade the defense artificial intelligence D-AI in response to the reward data. In contrast, in operation S67, the server device 250 may restore a version of the defense artificial intelligence D-AI to a previous version in response to the punishment data.

An operation of a reinforcement learning based client-server memory system is briefly described above.

According to embodiments of the present disclosure, it may be possible to build artificial intelligence (AI) that analyzes a deterioration factor by obtaining big data corresponding to various operating conditions or deterioration states and analyzing the obtained big data. Also, an optimum access parameter may be provided for each storage device by building the artificial intelligence AI that is based on a client-server model.

While concepts described herein have been described with reference to exemplary embodiments, it will be apparent to those skilled in the art that various changes and modifications may be made without departing from the spirit and scope of the concepts described herein. Therefore, it should be understood that the above embodiments are not limiting, but illustrative.

What is claimed is:

1. A memory system, comprising:
   a storage device that includes a nonvolatile memory device;
   a client device configured to collect deterioration information of the nonvolatile memory device provided from the storage device; and
   a server device configured to receive the collected deterioration information and to predict a degree of deterioration of the nonvolatile memory device in real time by performing machine learning based on the collected deterioration information and initial deterioration information,
   wherein the client device is configured to determine a read level of the nonvolatile memory device based on the degree of deterioration of the nonvolatile memory device predicted by the server device, and
   wherein the storage device is configured to set the nonvolatile memory device to operate based on the read level determined in the client device.

2. The memory system of claim 1, wherein the deterioration information comprises a read voltage of the nonvolatile memory and at least one of a program/erase count, a read count, a data retention time, access temperature information, location information of a to-be-accessed area, a program time, and an erase time, which correspond to the read voltage.

3. The memory system of claim 1, wherein the server device and the client device are connected over a communication network, and
   wherein the deterioration information is transferred from the client device to the server device on-line over the communication network.

4. The memory system of claim 1, wherein the deterioration information comprises access information and state information at a point in time when an uncorrectable error is generated from data read from the nonvolatile memory device.

5. The memory system of claim 1, wherein the server device uses at least one of interpolation, linear regression, and classification as an algorithm for the machine learning, which processes the collected deterioration information and the initial deterioration information.

6. The memory system of claim 5, wherein the linear regression comprises at least one multiple regression analysis, logistic regression, and RANSAC (RANdom SAmple Consensus).

7. The memory system of claim 5, wherein the classification comprises at least one of random forest and adaboost.

8. The memory system of claim 1, wherein the server device performs an outlier elimination operation or a dimensionality reduction operation on at least one of the collected deterioration information or the initial deterioration information before performing the machine learning.

9. The memory system of claim 1, wherein the client device evaluates performance of the nonvolatile memory device, which is achieved according to the determined read level, and performs reinforcement machine learning to provide a result of the evaluation as an evaluation result to the server device.

10. The memory system of claim 9, wherein the server device updates an algorithm for the machine learning based on the evaluation result.

11. The memory system of claim 9, wherein the evaluation result is provided as reward data or punishment data.

12. A method of deciding a read voltage of a plurality of storage devices connecting to a network, the method comprising:
   connecting a client with the storage devices and with a server over the network;
   collecting, at the client, deterioration information generated from at least one of the storage devices;
   predicting, at the server, a degree of deterioration of the at least one of the storage devices in real time by performing machine learning based on the collected deterioration information and initial deterioration information;
   deciding, at the client, a read level of each of the at least one of the storage devices based on the predicted degree of deterioration of the at least one of the storage devices; and
   setting an operating condition of the at least one of the storage devices with the corresponding read level decided at the client.

13. The method of claim 12, wherein each of the storage devices generates the deterioration information upon occurrence of a specific event and transmits the generated deterioration information to the client.

14. The method of claim 13, wherein the specific event comprises the case where the number of error bits of read data is a reference value or more or the case where an uncorrectable error is detected from the read data.

15. The method of claim 12, wherein the deterioration information comprises a read voltage of a nonvolatile memory included in at least one of the plurality of storage devices and at least one of a program/erase count, a read count, a data retention time, access temperature information, location information of a to-be-accessed area, a program time, and an erase time, which correspond to the read voltage.

16. The method of claim 12, wherein the predicting comprises:
   eliminating an outlier, which exceeds a specific reference, from big data corresponding to the collected deterioration information and the initial deterioration information; and
   performing dimensionality reduction on the big data from which the outlier is eliminated.

17. The method of claim 16, wherein in the performing of the dimensionality reduction, at least one of principal component analysis (PCA), singular value decomposition (SVD), and non-negative matrix factorization (NMF) is used as a dimensionality reduction algorithm.

18. The method of claim 12, further comprising:
   receiving performance information from any one storage device, which is set with the determined read level, of the storage devices;
   evaluating performance of the machine learning based on the performance information;
   transmitting the evaluation result to the server; and
   updating the machine learning based on the evaluation result.

19. A storage device, comprising:
   a nonvolatile memory device; and
   a storage controller configured to detect deterioration information of the nonvolatile memory device as detected deterioration information, transmit the detected deterioration information to a host of a client-server model, receive from the host a read voltage that is predicted and determined through machine learning using the deterioration information, write data in the nonvolatile memory device or read data stored in the nonvolatile memory device, to set the read voltage to the nonvolatile memory device, and to detect or correct an error of the read data,
   wherein the storage controller sets the nonvolatile memory device with the read voltage that is received from the host.

20. The storage device of claim 19, wherein the host comprises at least one of:
   a server device that predicts a degree of deterioration of the nonvolatile memory device by performing machine learning by using the deterioration information transferred on-line and initial deterioration information provided off-line; and
   a client device that collects the deterioration information provided from the storage controller to transfer the collected deterioration information to the server device and receives the predicted deterioration degree to determine a read voltage of the nonvolatile memory device, the client device providing the determined read voltage to the storage controller.

* * * * *